(12) United States Patent
Kadoshima et al.

(10) Patent No.: US 7,429,770 B2
(45) Date of Patent: Sep. 30, 2008

(54) SEMICONDUCTOR DEVICE AND MANUFACTURING METHOD THEREOF

(75) Inventors: Masaru Kadoshima, Tsukuba (JP); Koji Akiyama, Nirasaki (JP); Morifumi Ohno, Tokyo (JP)

(73) Assignees: Renesas Technology Corp., Tokyo (JP); Tokyo Electron Limited, Tokyo (JP); Oky Electric Industry Co., Ltd., Tokyo (JP)

( * ) Notice: Subject to any disclaimer, the term of this patent is extended or adjusted under 35 U.S.C. 154(b) by 131 days.

(21) Appl. No.: 11/037,333

(22) Filed: Jan. 19, 2005

(65) Prior Publication Data

US 2005/0167762 A1 Aug. 4, 2005

(30) Foreign Application Priority Data

Jan. 30, 2004 (JP) ............................. 2004-023568

(51) Int. Cl.
*H01L 29/76* (2006.01)
*H01L 29/94* (2006.01)
*H01L 21/338* (2006.01)
*H01L 21/3205* (2006.01)

(52) U.S. Cl. ...................... 257/338; 257/351; 257/384; 257/388; 257/412; 257/E27.062; 438/169; 438/199; 438/592; 438/655

(58) Field of Classification Search ................. 438/169, 438/199, 592, 655; 257/338, 351, 384, 388, 257/412

See application file for complete search history.

(56) References Cited

U.S. PATENT DOCUMENTS

| | | | |
|---|---|---|---|
| 6,475,908 B1 | 11/2002 | Lin et al. | |
| 6,563,178 B2 | 5/2003 | Moriwaki et al. | |
| 6,599,831 B1 | 7/2003 | Maszara et al. | |
| 6,929,992 B1* | 8/2005 | Djomehri et al. | 438/199 |
| 7,052,945 B2* | 5/2006 | Snyder | 438/197 |
| 2004/0065930 A1 | 4/2004 | Lin et al. | |
| 2004/0142546 A1 | 7/2004 | Kudo et al. | |
| 2006/0131652 A1* | 6/2006 | Li | 257/350 |

FOREIGN PATENT DOCUMENTS

| | | |
|---|---|---|
| JP | 04-188868 | 7/1992 |
| JP | 06-151855 | 5/1994 |
| JP | 9-321304 | 12/1997 |
| JP | 10-055984 | 2/1998 |
| JP | 10-242079 | 9/1998 |
| JP | 2000-031472 | 1/2000 |
| JP | 2000-252462 | 9/2000 |
| JP | 2002-118175 | 4/2002 |
| JP | 2003-258121 | 9/2003 |

(Continued)

*Primary Examiner*—Hsien-ming Lee
(74) *Attorney, Agent, or Firm*—Antonelli, Terry, Stout & Kraus, LLP.

(57) ABSTRACT

A technique capable of reducing threshold voltage and reducing high-temperature heat treatment after forming a gate electrode is provided. An n-type MIS transistor or a p-type MIS transistor is formed on an active region isolated by an element isolation region of a semiconductor substrate. In the n-type MIS transistor, a gate electrode is formed through a gate insulating film, and the gate electrode is composed of a hafnium silicide film. On the other hand, in the p-type MIS transistor, a gate electrode is formed through a gate insulating film, and the gate electrode is composed of a platinum silicide film. Also, the gate electrodes are formed after the activation annealing (heat treatment) for activating impurities implanted into a source region and a drain region.

14 Claims, 16 Drawing Sheets

FOREIGN PATENT DOCUMENTS

| | | |
|---|---|---|
| JP | 2004-152995 | 5/2004 |
| JP | 2005-123626 | 5/2005 |
| JP | 2005-520341 | 7/2005 |
| WO | WO 03/079424 | 9/2003 |

* cited by examiner

SEMICONDUCTOR DEVICE AND MANUFACTURING METHOD THEREOF

CROSS-REFERENCE TO RELATED APPLICATION

The present application claims priority from Japanese Patent Application JP 2004-023568 filed on Jan. 30, 2004, the content of which is hereby incorporated by reference into this application.

TECHNICAL FIELD OF THE INVENTION

The present invention relates to a semiconductor device and a manufacturing technique thereof. More particularly, it relates to the technique for reducing a threshold voltage which is effective when applied to a MIS (Metal Insulator Semiconductor) transistor and a manufacturing technique thereof.

BACKGROUND OF THE INVENTION

In a conventional technique, in order to achieve the low threshold voltage in both an n-type MOS transistor and a p-type MOS transistor of a CMOS (Complementary Metal Oxide Semiconductor) transistor, a so-called dual gate structure in which the gate electrodes are formed of materials having different work functions (Fermi potential in the case of polysilicon) has been employed. More specifically, an n-type impurity and a p-type impurity are implanted into polysilicon films which form the gate electrodes of an n-type MOS transistor and a p-type MOS transistor so as to approximate the work function (Fermi potential) of a gate electrode material of the n-type MOS transistor to the conduction band of silicon and to approximate the work function (Fermi potential) of a gate electrode material of the p-type MOS transistor to the valence band of silicon, thereby reducing the threshold values.

However, in recent years, the thickness of a gate insulating film has become smaller along with the scaling down of a CMOS transistor, and the depletion of a gate electrode when a polysilicon film is used for a gate electrode has become non-negligible. More specifically, an electrical equivalent silicon oxide thickness of the gate insulating film made of a silicon oxide film or the like must be set to about 2 nm or smaller due to the scaling down. However, in this case, a parasitic capacity generated in the gate electrode by the depletion of the gate electrode becomes so large that cannot be neglected. For this reason, the use of a metal film as a gate electrode material instead of a polysilicon film has been examined (for example, Japanese Patent Application Laid-Open No. 2002-118175).

SUMMARY OF THE INVENTION

When a metal film is used as a gate electrode material, in order to reduce threshold voltages of both an n-type MIS transistor and a p-type MIS transistor, metal films each having different work functions are used in the n-type MIS transistor and the p-type MIS transistor (dual metal gate). More specifically, in the n-type MIS transistor, a metal film having a value of work function that is relatively small and approximate to a conduction band of silicon is used. On the other hand, in the p-type MIS transistor, a metal film having a value of work function that is relatively large and approximate to a valence band of silicon is used.

However, in the conventional manufacturing process of a CMIS transistor, a source region and a drain region are formed after forming a gate electrode, and high-temperature heat treatment for the activation of the impurity introduced by the ion-implantation method (activation annealing) is performed when the source region and the drain region are formed. Due to this high-temperature heat treatment, the metal constituting the gate electrode reacts with a gate insulating film in the n-type MIS transistor and the electrical properties of the MIS transistor are degraded. In addition, in the p-type MIS transistor, the metal constituting the gate electrode is peeled from the gate insulating film and metal atoms are diffused in the gate insulating film and the silicon substrate by the high-temperature heat treatment, and the electrical properties of the MIS transistor are degraded disadvantageously.

An object of the present invention is to provide a technique that can reduce a threshold voltage and control the high-temperature heat treatment performed after forming a gate electrode.

The above and other objects and novel characteristics of the present invention will be apparent from the description and the accompanying drawings of this specification.

The typical ones of the inventions disclosed in this application will be briefly described as follows.

A semiconductor device according to the present invention comprises: (a) an n-channel first MIS transistor; and (b) a p-channel second MIS transistor, wherein a first gate electrode of the first MIS transistor and a second gate electrode of the second MIS transistor are formed of different metal silicide films, respectively.

Also, the present invention provides a manufacturing method of a semiconductor device, in which an n-channel first MIS transistor and a p-channel second MIS transistor are manufactured, comprising the steps of: (a) forming an insulating film on a semiconductor substrate; (b) forming a polysilicon film on the insulating film; (c) selectively etching the polysilicon film to form a first dummy electrode of the first MIS transistor and a second dummy electrode of the second MIS transistor; (d) forming a first n-type impurity region so as to be aligned with the first dummy electrode; (e) forming a first p-type impurity region so as to be aligned with the second dummy electrode; (f) forming a first sidewall on a sidewall of the first dummy electrode and forming a second sidewall on a sidewall of the second dummy electrode; (g) forming a second n-type impurity region having an impurity concentration higher than that of the first n-type impurity region so as to be aligned with the first sidewall; (h) forming a second p-type impurity region having an impurity concentration higher than that of the first p-type impurity region so as to be aligned with the second sidewall; (i) forming a first metal film on the first dummy electrode; (j) performing heat treatment to cause the polysilicon film constituting the first dummy electrode to react with the first metal film to form a first gate electrode composed of a first metal silicide film; (k) forming a second metal film different from the first metal film on the second dummy electrode; and (l) performing heat treatment to cause the polysilicon film constituting the second dummy electrode to react with the second metal film to form a second gate electrode composed of a second metal silicide film.

The effect obtained by the representative one of the inventions disclosed in this application will be briefly described as follows.

A threshold voltage of a MIS transistor can be reduced. Also, high-temperature heat treatment at about 1000° C. required for the activation of an impurity can be performed before forming a gate electrode made of metal silicide, and therefore, it is possible to prevent the degradation of electrical properties caused when the heat treatment is performed after forming the meal silicide gate.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
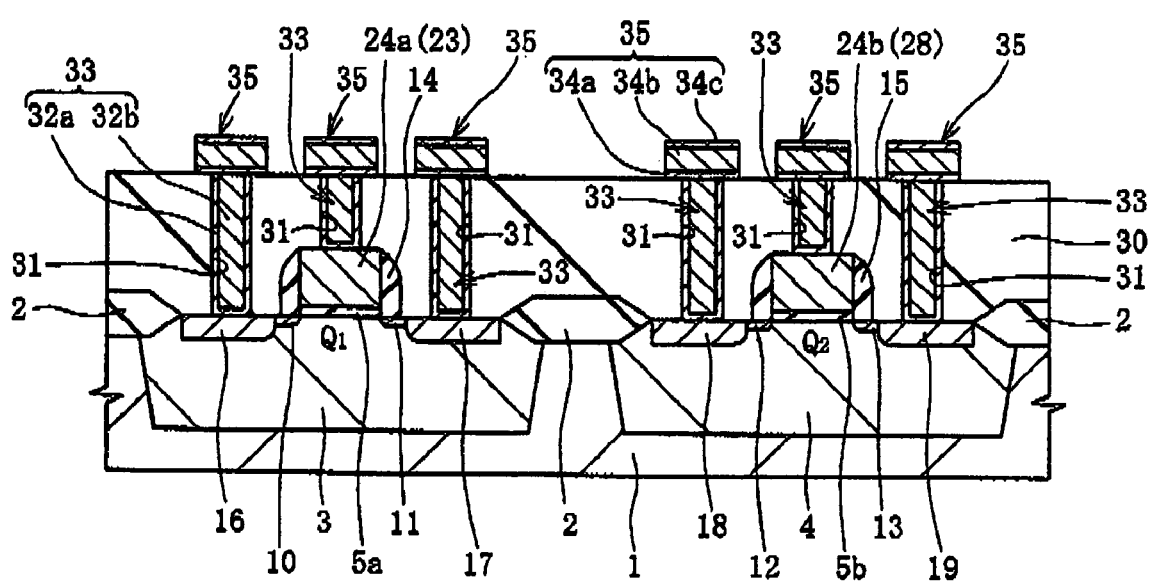
FIG. 1 is a cross-sectional view showing a semiconductor device according to a first embodiment of the present invention.

FIG. 1 is a cross-sectional view showing an n-channel MIS transistor Q1 (referred to as an n-type MIS transistor Q1 hereinafter) and a p-channel MIS transistor Q2 (referred to as a p-type MIS transistor Q2 hereinafter) according to a first embodiment. In FIG. 1, element isolation regions 2 for isolating elements are formed on a semiconductor substrate 1, and a p-type well 3 and an n-type well 4 are formed in active regions isolated by the element isolation regions 2.

The n-type MIS transistor Q1 is formed on the p-type well 3, and the p-type MIS transistor Q2 is formed on the n-type well 4.

The n-type MIS transistor Q1 has a gate insulating film (first gate insulating film) 5a composed of, for example, a silicon oxide film and a gate electrode (first gate electrode) 24a on the gate insulating film 5a. The gate electrode 24a is formed of, for example, a hafnium silicide film 23. Since the value of work function of the hafnium silicide film 23 is about 4 eV, the hafnium silicide film has a work function approximate to a conduction band of silicon. Therefore, the threshold voltage can be reduced by using the hafnium silicide film 23 as the gate electrode 24a. The case where the hafnium silicide film 23 is used as an example of the gate electrode 24a has been exemplified. However, the gate electrode 24a is not limited to the hafnium silicide film 23, and the threshold voltage of the n-type MIS transistor Q1 can be reduced by using another metal silicide film having a value of work function approximate to a conduction band of silicon.

Next, a sidewall (first sidewall) 14 composed of an insulating film is formed on a sidewall of the gate electrode 24a, and low-concentration n-type impurity diffusion regions (first n-type impurity regions) 10 and 11 are formed in the p-type well 3 under the sidewall 14.

High-concentration n-type impurity diffusion regions (second n-type impurity regions) 16 and 17 having impurity concentrations higher than those of the low-concentration n-type impurity diffusion regions 10 and 11 are formed outside the low-concentration n-type impurity diffusion regions 10 and 11, respectively. The low-concentration n-type impurity diffusion region 10 and the high-concentration n-type impurity diffusion region 16 form a source region (first source region) of the n-type MIS transistor Q1, and the low-concentration n-type impurity diffusion region 11 and the high-concentration n-type impurity diffusion region 17 form a drain region (first drain region) of the n-type MIS transistor Q1.

The p-type MIS transistor Q2 has a gate insulating film (second gate insulating film) 5b composed of, for example, a silicon oxide film and a gate electrode (second gate electrode) 24b on the gate insulating film 5b. The gate electrode 24b is formed of, for example, a platinum silicide film 28. Since the value of work function of the platinum silicide film 28 is about 5 eV, the platinum silicide film 28 has a work function approximate to a valence band of silicon. Therefore, the threshold voltage of the p-type MIS transistor can be reduced by using the platinum silicide film 28 as the gate electrode 24b.

Next, a sidewall (second sidewall) 15 composed of an insulating film is formed on a sidewall of the gate electrode 24b, and low-concentration p-type impurity diffusion regions (first p-type impurity regions) 12 and 13 are formed in the n-type well 4 under the sidewall 15.

High-concentration p-type impurity diffusion regions (second p-type impurity regions) 18 and 19 having impurity concentrations higher than those of the low-concentration p-type impurity diffusion regions 12 and 13 are formed outside the low-concentration p-type impurity diffusion regions 12 and 13, respectively. The low-concentration p-type impurity diffusion region 12 and the high-concentration p-type impurity diffusion region 18 form a source region (second source region) of the p-type MIS transistor Q2, and the low-concentration p-type impurity diffusion region 13 and the high-concentration p-type impurity diffusion region 19 form a drain region (second drain region) of the p-type MIS transistor Q2.

As described above, in the first embodiment, different metal silicide films are used for the gate electrode 24a of the n-type MIS transistor Q1 and the gate electrode 24b of the p-type MIS transistor Q2. More specifically, the hafnium silicide film 23 having a work function approximate to the conduction band of silicon is used for the gate electrode 24a of the n-type MIS transistor Q1, and the platinum silicide film 28 having a work function approximate to the valence band of silicon is used for the gate electrode 24b of the p-type MIS transistor Q2. Therefore, threshold voltages can be reduced in both the n-type MIS transistor Q1 and the p-type MIS transistor Q2, and therefore, it is possible to achieve low power consumptions and high-speed operation of the transistors.

Next, an experiment for a method of forming the hafnium silicide film 23 and the platinum silicide film 28 used as the gate electrode 24a and the gate electrode 24b is performed. The experiment is performed under the following conditions. That is, after a gate insulating film composed of a silicon oxide film with a thickness of 10 nm is formed on a semiconductor substrate, a polysilicon film with a thickness of 100 nm is formed on the gate insulating film, and a platinum film with a thickness of 100 nm is formed on the polysilicon film by a DC magnetron sputtering method. In this configuration, heat treatment at 400° C. in a nitrogen gas is performed for one hour. As a result, it is confirmed that the polysilicon film has reacted with the platinum film to form a platinum silicide film.

On the other hand, after a gate insulating film composed of a silicon oxide film with a thickness of 10 nm is formed on the semiconductor substrate, a platinum film is formed on the gate insulating film. In this state, the heat treatment under the same conditions as described above is performed. As a result, it is confirmed that a silicide reaction does not progress. Therefore, it is confirmed that a silicide reaction progresses in a region in which the polysilicon film and the platinum film are in contact with each other and that a silicide reaction does not progress in a region in which the silicon oxide film and the platinum film are in contact with each other. It can be confirmed that the same is true of the case where a hafnium film is used instead of the platinum film and heat treatment at 500° C. is performed.

In consideration of the experiment result, a manufacturing method of the n-type MIS transistor Q1 and the p-type MIS transistor Q2 according to the first embodiment will be described below with reference to the accompanying drawing.

Figure 2:
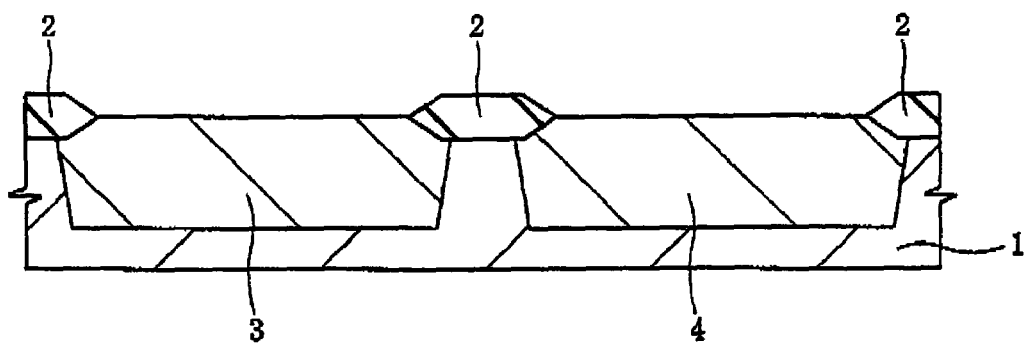
FIG. 2 is a cross-sectional view showing a step of manufacturing a semiconductor device according to the first embodiment.

First, as shown in FIG. 2, the semiconductor substrate 1 obtained by implanting a p-type impurity such as boron (B) into single crystal silicon is prepared. Next, the element isolation region 2 is formed on a main surface of the semiconductor substrate 1. The element isolation region 2 is composed of, for example, a silicon oxide film and formed by an STI (Shallow Trench Isolation) method, a LOCOS (Local Oxidization of Silicon) method, or the like. FIG. 2 shows the element isolation region 2 formed by the LOCOS method in which a predetermined region of a semiconductor substrate is selectively oxidized by the use of the oxidization resistance of a silicon nitride film.

Next, the p-type well 3 is formed in the semiconductor substrate 1. The p-type well 3 is formed by implanting a p-type impurity such as boron or boron fluoride into the semiconductor substrate 1 by using, for example, a photolithography technique and an ion implantation method. Similarly, the n-type well 4 is formed in the semiconductor substrate 1. The n-type well 4 is formed by implanting an n-type impurity such as phosphorous or arsenic into the semiconductor substrate 1 by using, for example, the photolithography technique and the ion implantation method.

Figure 3:
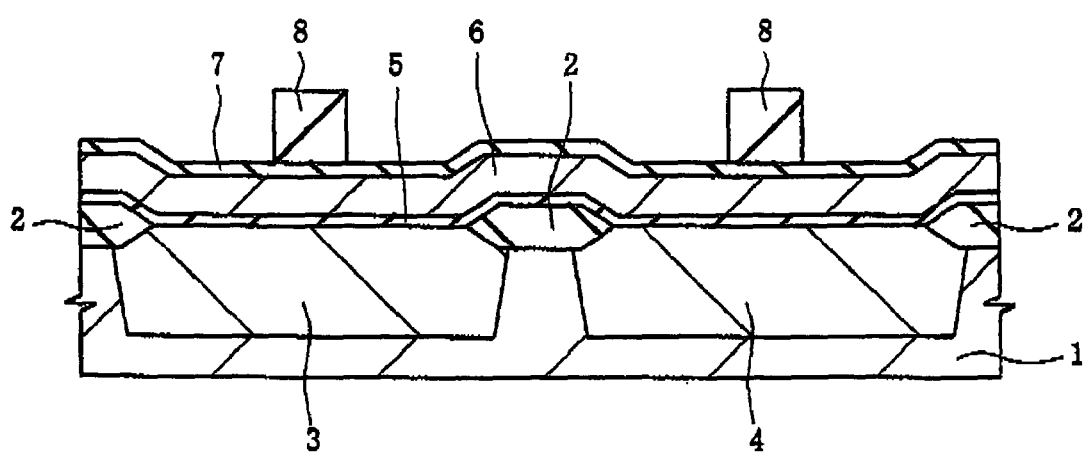
FIG. 3 is a cross-sectional view showing a step of manufacturing the semiconductor device subsequent to the step in FIG. 2.

Subsequently, as shown in FIG. 3, an insulating film 5 serving as a gate insulating film is formed on the semiconductor substrate 1. The insulating film 5 is composed of, for example, a silicon oxide film and can be formed by, for example, a thermal oxidation method.

Conventionally, a silicon oxide film is used as the insulating film 5 because the silicon oxide film has a high withstand voltage, a small leak current, excellent electrical and physical stability at a silicon-silicon oxide interface, and the like.

However, with the scaling down of the elements, the further thickness reduction of the insulating film 5 has been demanded. When such a thin gate insulating film is used, a so-called tunnel current phenomenon occurs, in which electrons flowing in the channel of a MOS transistor tunnel through a barrier formed of the silicon oxide film and flow into a gate electrode.

For this reason, a High-k film which can increase a physical film thickness by using a material having a dielectric constant higher than that of silicon oxide has begun to be used. Therefore, although the case where the insulating film 5 is composed of a silicon oxide film has been described above, the insulating film 5 is not limited to the silicon oxide film. For example, a so-called High-k film or a silicon oxynitride film made of hafnium oxide, alumina (aluminum oxide), hafnium aluminate, zirconia (zirconium oxide), silicon nitride, a rare-earth oxide such as $La_2O_3$, or the like may be used.

Next, a polysilicon film 6 is formed on the insulating film 5. The polysilicon film 6 can be formed by using a CVD (Chemical Vapor Deposition) method that thermally decomposes a silane gas in a nitrogen gas while being heated to, for example, about 550° C. to 650° C.

Subsequently, a silicon oxide film 7 is formed on the polysilicon film 6. The silicon oxide film 7 is a film that functions as a hard mask when forming a dummy gate electrode (described later). For example, the silicon oxide film 7 can be formed by a CVD method using TEOS (Tetra Ethyl Ortho Silicate) while being heated to about 600° C. to 700° C.

Next, a resist film 8 is formed on the silicon oxide film 7 by using, for example, a spin coating method. Then, the resist film 8 thus coated is patterned by performing exposure and development. The patterning is performed so as to leave the resist film 8 in a region in which a dummy electrode is to be formed.

Figure 4:
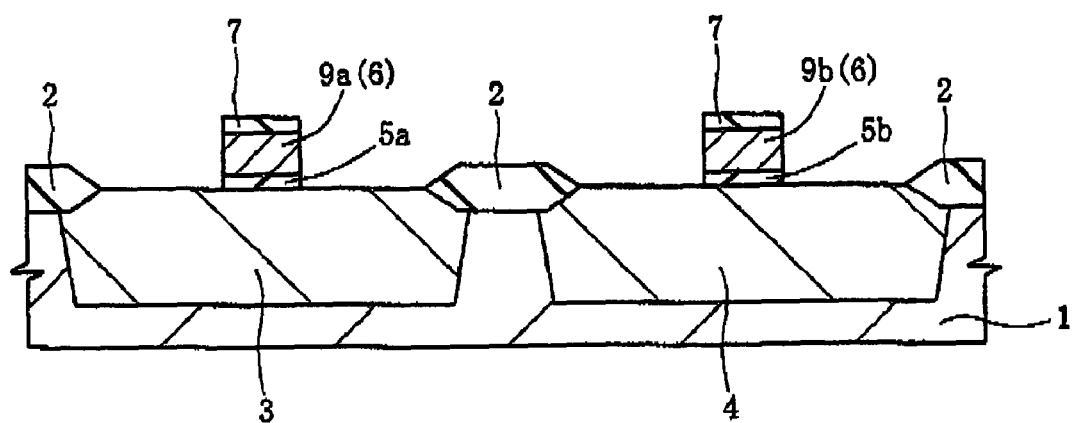
FIG. 4 is a cross-sectional view showing a step of manufacturing the semiconductor device subsequent to the step in FIG. 3.

Subsequently, after the silicon oxide film 7 is dry-etched with using the patterned resist film 8 as a mask, the resist film 8 is removed. Thereafter, as shown in FIG. 4, the polysilicon film 6 is dry-etched with using the patterned silicon oxide film 7 as a hard mask to form a dummy electrode (first dummy electrode) 9a and a dummy electrode (second dummy electrode) 9b. Then, the insulating film 5 exposed by etching the polysilicon film 6 is removed by a diluted hydrofluoric acid to form a gate insulating film (first gate insulating film) 5a and a gate insulating film (second gate insulating film) 5b which are composed of the insulating film 5 only under the dummy electrodes 9a and 9b.

Figure 5:
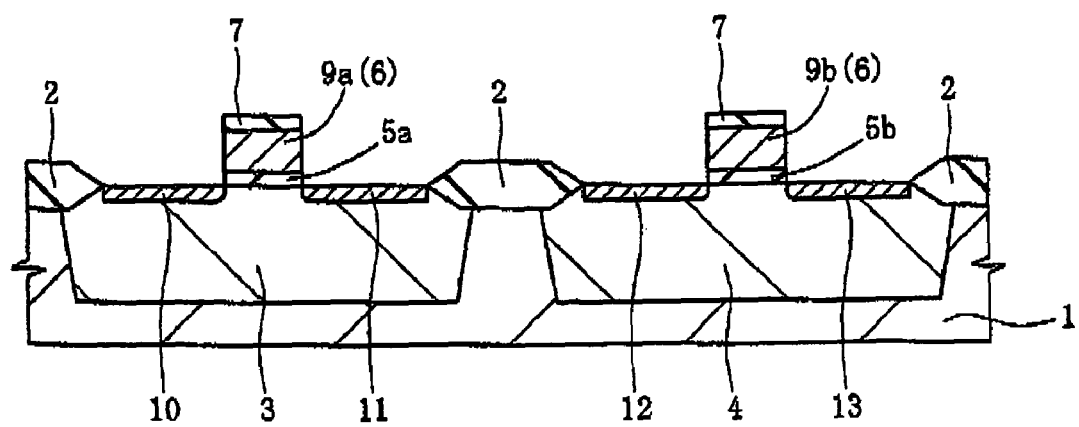
FIG. 5 is a cross-sectional view showing a step of manufacturing the semiconductor device subsequent to the step in FIG. 4.

Next, as shown in FIG. 5, the low-concentration n-type impurity diffusion regions (first n-type impurity regions) 10 and 11 serving as semiconductor regions are formed so as to be 6 aligned with the dummy electrode 9a. The low-concentration n-type impurity diffusion regions 10 and 11 can be formed by, for example, introducing an n-type impurity such as phosphorous or arsenic into the semiconductor substrate 1 by using a photolithography technique and an ion implantation method. Similarly, the low-concentration p-type impurity diffusion regions (first p-type impurity regions) 12 and 13 serving as semiconductor regions are formed so as to be aligned with the dummy electrode 9b. The low-concentration p-type impurity diffusion regions 12 and 13 can be formed by introducing a p-type impurity such as boron into the semiconductor substrate 1 by using, for example, the photolithography technique and the ion implantation method.

Figure 6:
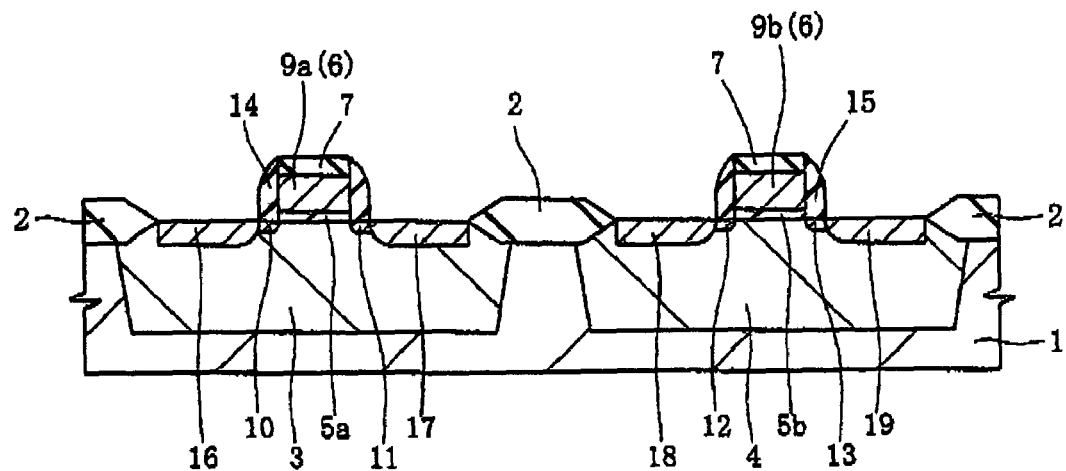
FIG. 6 is a cross-sectional view showing a step of manufacturing the semiconductor device subsequent to the step in FIG. 5.

Subsequently, as shown in FIG. 6, after a silicon nitride film is formed on a main surface of the semiconductor substrate 1 by using, for example, a plasma CVD method, the silicon nitride film is anisotropically etched to form the sidewall (first sidewall) 14 and the sidewall (second sidewall) 15 on the sidewalls of the dummy electrodes 9a and 9b. Note that although the sidewalls 14 and 15 are formed of silicon nitride films, the sidewalls 14 and 15 are not limited to the silicon nitride films. The sidewalls 14 and 15 may be formed of, for example, silicon nitride films, a silicon oxynitride film, or a laminated film of a silicon oxide film and a silicon nitride film.

Next, the high-concentration n-type impurity diffusion regions (second n-type impurity regions) 16 and 17 are formed in a region in the semiconductor substrate 1 so as to be aligned with the sidewall 14. The high-concentration n-type impurity diffusion regions 16 and 17 are formed by using, for example, a photolithography technique and an ion implantation method, and an n-type impurity such as phosphorous or arsenic is implanted at a concentration higher than that of the low-concentration n-type impurity diffusion regions 10 and 11. Similarly, the high-concentration p-type impurity diffusion regions (second p-type impurity regions) 18 and 19 are formed in a region in the semiconductor substrate 1. The high-concentration p-type impurity diffusion regions 18 and 19 are formed by using, for example, the photolithography technique and the ion implantation method, and a p-type impurity such as boron is implanted at a concentration higher than that of the low-concentration p-type impurity diffusion region 12 or 13.

Figure 7:
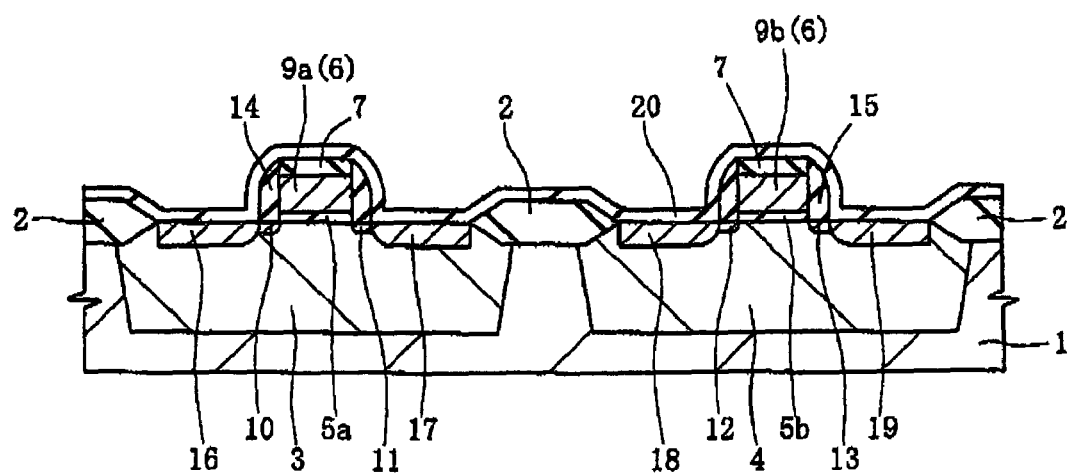
FIG. 7 is a cross-sectional view showing a step of manufacturing the semiconductor device subsequent to the step in FIG. 6.

Subsequently, as shown in FIG. 7, a silicon oxide film 20 is formed on a main surface of the semiconductor substrate 1. The silicon oxide film 20 can be formed by a CVD method using TEOS while being heated to a temperature of, for example, about 600° C. to 700° C.

Next, activation annealing is performed to activate the impurities implanted into the low-concentration n-type impurity diffusion regions 10 and 11, the low-concentration p-type impurity diffusion regions 12 and 13, the high-concentration n-type impurity diffusion regions 16 and 17, and the high-concentration p-type impurity diffusion regions 18 and 19. The activation annealing is performed at a high temperature of, for example, about 850° C. to 1050° C.

Figure 8:
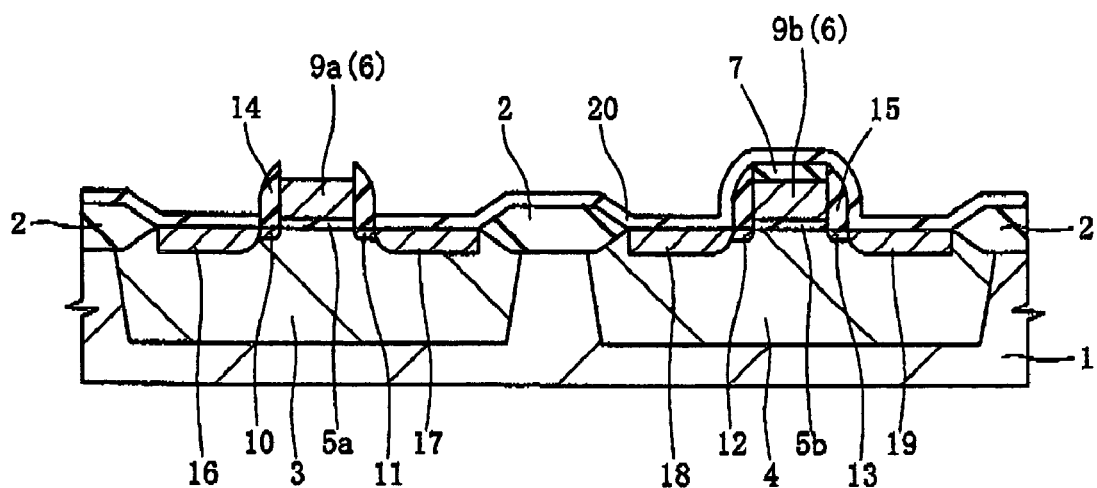
FIG. 8 is a cross-sectional view showing a step of manufacturing the semiconductor device subsequent to the step in FIG. 7.
Figure 9:
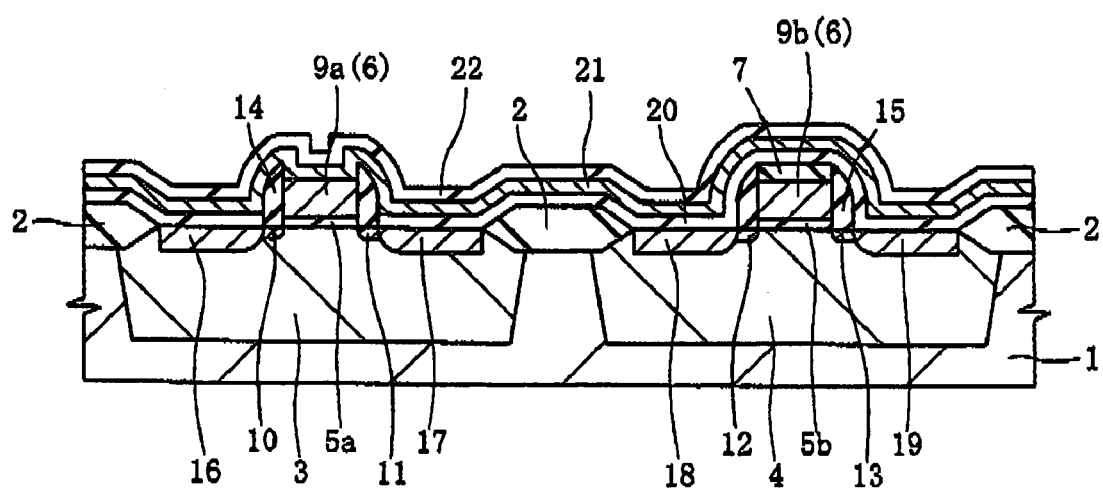
FIG. 9 is a cross-sectional view showing a step of manufacturing the semiconductor device subsequent to the step in FIG. 8.

Subsequently, as shown in FIG. 8, the silicon oxide film 20 and the silicon oxide film 7 formed on the dummy electrode 9a are removed by using a photolithography technique and an etching technique. Then, as shown in FIG. 9, a hafnium film 21 and a silicon oxide film 22 are sequentially formed on a main surface of the semiconductor substrate 1. The hafnium film 21 can be formed by using, for example, a CVD method or a sputtering method. Also, the silicon oxide film 22 can be formed by using a plasma CVD method using TEOS or a CVD method using a silane gas and an oxygen gas. The silicon oxide film 22 has a function to prevent the oxidation of the surface of the hafnium film 21 and to reduce the abnormal crystal growth in the heat treatment (described later). Depending on processes, the silicon oxide film 22 may be omitted.

Figure 10:
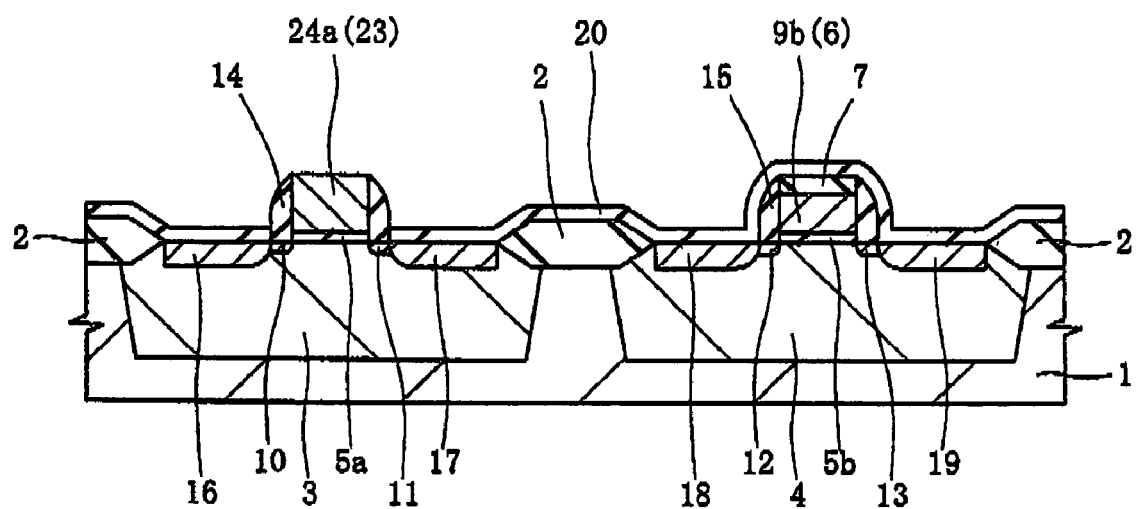
FIG. 10 is a cross-sectional view showing a step of manufacturing the semiconductor device subsequent to the step in FIG. 9.

Next, heat treatment at about 450° C. to 700° C. is performed to the semiconductor substrate 1. This heat treatment causes a silicide reaction between the polysilicon film 6 constituting the dummy electrode 9a and the hafnium film 21, and the gate electrode 24a composed of the hafnium silicide film (first metal silicide film) 23 as shown in FIG. 10 is formed. Note that, at a position except for the dummy electrode 9a, the hafnium film 21 is in contact with the silicon oxide film 20 not with silicon. For this reason, as described in the experiment, a silicide reaction does not occur.

Subsequently, as shown in FIG. 10, the unreacted hafnium film 21 and the silicon oxide film 22 are removed. The silicon oxide film 22 is removed by using, for example, diluted hydrofluoric acid. Also, the unreacted hafnium film 21 is removed by a mixed solution of hydrofluoric acid and nitric acid.

Figure 11:
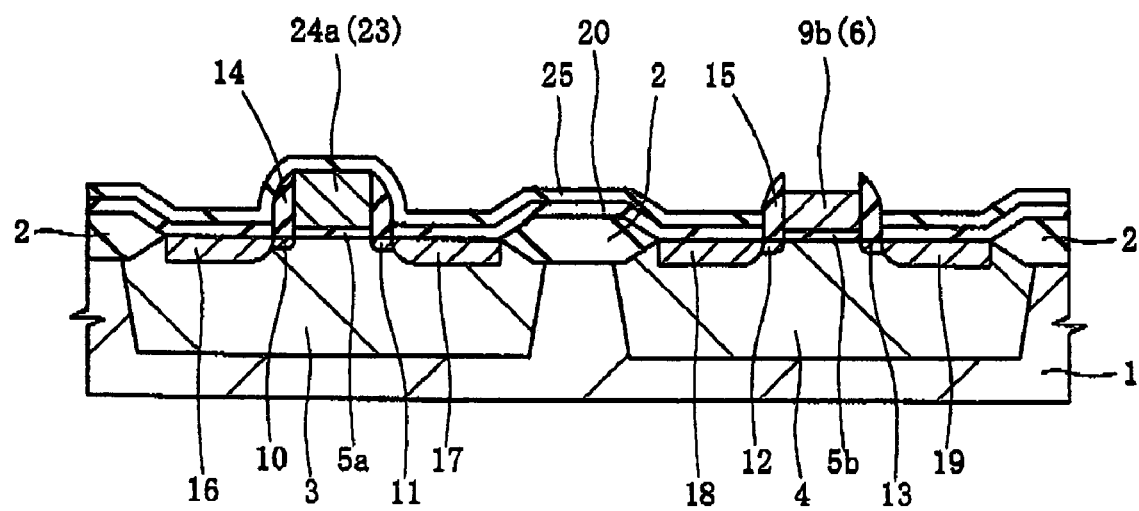
FIG. 11 is a cross-sectional view showing a step of manufacturing the semiconductor device subsequent to the step in FIG. 10.

Next, as shown in FIG. 11, a silicon oxide film 25 is formed on a main surface of the semiconductor substrate 1. The silicon oxide film 25 can be formed by a plasma CVD method using TEOS or a CVD method using a silane gas and an oxygen gas. Thereafter, the silicon oxide film 25 and the silicon oxide film 7 formed on the dummy electrode 9b are removed by using a photolithography technique and an etching technique. In this manner, the polysilicon film 6 is exposed only on the upper portion of the dummy electrode 9b, and a region except for the dummy electrode 9b is covered with the silicon oxide film 25.

Figure 12:
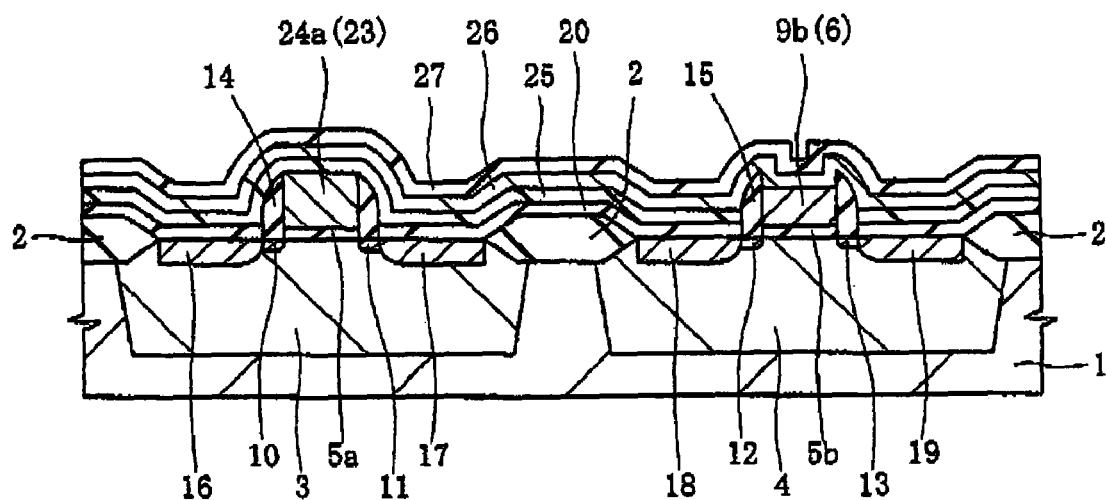
FIG. 12 is a cross-sectional view showing a step of manufacturing the semiconductor device subsequent to the step in FIG. 11.

Subsequently, as shown in FIG. 12, a platinum film 26 and a silicon oxide film 27 are sequentially formed on the silicon oxide film 25 and the dummy electrode 9b. The platinum film 26 can be formed by using, for example, a sputtering method, and the silicon oxide film 27 can be formed by, for example, a CVD method. The silicon oxide film 27 has a function to prevent the oxidation of the platinum film 26 and to reduce the abnormal crystal growth in the heat treatment (described later). The silicon oxide film 27 also has a function to prevent the contamination due to platinum.

Figure 13:
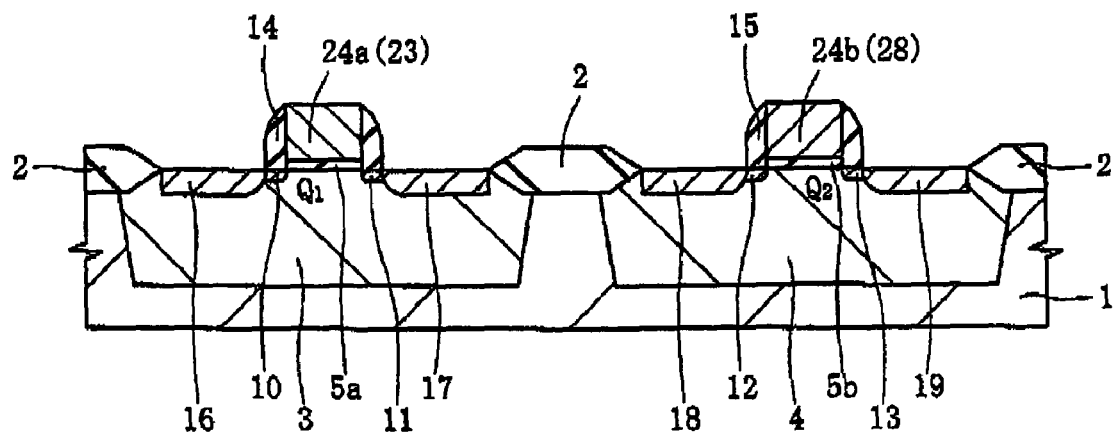
FIG. 13 is a cross-sectional view showing a step of manufacturing the semiconductor device subsequent to the step in FIG. 12.

Next, heat treatment at about 300° C. to 500° C. is performed to the resultant structure. This heat treatment causes a silicide reaction between the polysilicon film 6 constituting the dummy electrode 9b and the platinum film 26, and the gate electrode 24b formed of the platinum silicide film (second metal silicide film) 28 as shown in FIG. 13 is formed. On the other hand, since a region except for the dummy electrode 9b is covered with the silicon oxide film 25, a silicide reaction does not occur. Note that, in the description above, the heat treatment at about 300° C. to 500° C. is performed after the silicon oxide film 27 is formed to cause a silicide reaction between the polysilicon film 6 and the platinum film 26. However, the silicide reaction between the polysilicon film 6 and the platinum film 26 may be caused by the heat treatment performed when the silicon oxide film 27 is formed.

Thereafter, as shown in FIG. 13, the silicon oxide film 27 and the unreacted platinum film 26 are removed. The silicon oxide film 27 is removed by using, for example, diluted hydrofluoric acid, and the platinum film 26 is removed by, for example, diluted nitrohydrochloric acid obtained by mixing hydrochloric acid and nitric acid at a ratio of about 3 to 1.

Subsequently, the silicon oxide film 25 formed on a main surface of the semiconductor substrate 1 is also removed. Next, a wiring process will be described below. As shown in FIG. 1, a silicon oxide film 30 is formed on a main surface of the semiconductor substrate 1. The silicon oxide film 30 can be formed by using, for example, a CVD method. Thereafter, the surface of the silicon oxide film 30 is planarized by, for example, a CMP (Chemical Mechanical Polishing) method.

Subsequently, a contact hole 31 is formed in the silicon oxide film 30 by using a photolithography technique and an etching technique. Then, a titanium/titanium nitride film 32a is formed on the silicon oxide film 30 and on the bottom surface and the inner wall of the contact hole 31. The titanium/titanium nitride film 32a is formed of a laminated film of a titanium film and a titanium nitride film, and can be formed by using, for example, a sputtering method.

Next, a tungsten film 32b is formed on a main surface of the semiconductor substrate 1 so as to bury the contact hole 31. The tungsten film 32b can be formed by using, for example, a CVD method. Then, the unnecessary titanium/titanium nitride film 32a and the unnecessary tungsten film 32b formed on the silicon oxide film 30 are removed by using, for example, a CMP method to form a plug 33.

Next, a titanium/titanium nitride film 34a, an aluminum film 34b, and a titanium/titanium nitride film 34c are sequentially formed on the silicon oxide film 30 and the plug 33. These films can be formed by using, for example, a sputtering method. Subsequently, these films are patterned by using a photolithography technique and an etching technique to form a wiring 35.

In this manner, the n-type MIS transistor Q1 in which the hafnium silicide film 23 is used as the gate electrode 24a and the p-type MIS transistor Q2 in which the platinum silicide film 28 is used as the gate electrode 24b can be formed. Therefore, threshold voltages in both the n-type MIS transistor Q1 and the p-type MIS transistor Q2 can be reduced.

In a manufacturing method of a semiconductor device according to the first embodiment, after the dummy electrodes 9a and 9b composed of the polysilicon film 6 are formed, the source region and the drain region of the MIS transistors are formed so as to be aligned with the dummy electrodes 9a and 9b. Then, after the activation annealing to activate the impurities in the source region and the drain region is performed, the gate electrode 24a composed of the hafnium silicide film 23 and the gate electrode 24b composed of the platinum silicide film 28 are formed. Therefore, different from the conventional manufacturing method of a MIS transistor, activation annealing is not performed after the gate electrodes are formed. More specifically, since the gate electrodes 24a and 24b are formed after the source region and the drain region are formed, a high-temperature heat load is not applied to the gate electrodes 24a and 24b in the manufacturing method of a semiconductor device according to the first embodiment.

As described above, since the high-temperature heat load is not applied to the gate electrodes 24a and 24b in the first embodiment, it is possible to achieve the following effects.

When a high-temperature heat load as in the activation annealing is applied to a gate electrode 24a composed of a metal silicide film, the gate electrode 24a reacts with the gate insulating film 5a formed under the gate electrode 24a to form a new insulating film between the gate insulating film 5a and the gate electrode 24a. As a result, the film thickness of the gate insulating film 5a formed under the gate electrode 24a substantially increases, and the electrical properties of the MIS transistor vary, that is, the variation of a threshold voltage. However, in the first embodiment, since the gate electrode 24a composed of a metal silicide film is formed after the activation annealing, a high-temperature heat load is not applied to the gate electrode 24a, which makes it possible to prevent reaction between the gate electrode 24a and the gate insulating film 5a. Therefore, according to the first embodiment, the variation of the electrical properties of the MIS transistor can be reduced.

Also, when a high-temperature load is applied to the gate electrodes 24a and 24b, the stress generating in the gate electrodes 24a and 24b increases and interface states between the gate electrodes 24a and 24b and the gate insulating films tend to increase. However, in the first embodiment, since high-temperature heat treatment such as activation annealing is not applied after the gate electrodes 24a and 24b are formed, the increase of the stress and the interface state can be prevented, which makes it possible to reduce the variation of a threshold value due to the stress and the interface state and reduce the deterioration of the mobility of carriers.

In addition, when a high-temperature load is applied to the gate electrodes 24a and 24b, metal elements constituting the gate electrodes 24a and 24b are diffused in the gate insulating films 5a and 5b and the semiconductor substrate 1. When the metal elements are diffused in the gate insulating films 5a and 5b, the withstand voltage of the gate insulating films 5a and 5b decreases and a leakage current increases. On 6 the other hand, when the metal elements are diffused in the semiconductor substrate 1 through the gate insulating films 5a and 5b, the threshold voltage varies. However, in the first embodiment, since high-temperature heat treatment such as activation annealing is not performed after the gate electrodes 24a and 24b are formed, it is possible to prevent the diffusion of the metal elements constituting the gate electrodes 24a and 24b into the gate insulating films 5a and 5b and the semiconductor substrate 1.

Since high-temperature annealing such as activation annealing is not performed in the formation of the gate electrodes 24a and 24b, the profile of the impurity implanted into the source region, the drain region, or the channel region need not be changed.

Second Embodiment

In the first embodiment, the case where a metal silicide film is used as a gate electrode has been described. Meanwhile, in the description of the second embodiment, a film of the same type as that of a metal silicide film constituting a gate electrode is formed on a source region and a drain region.

Figure 14:
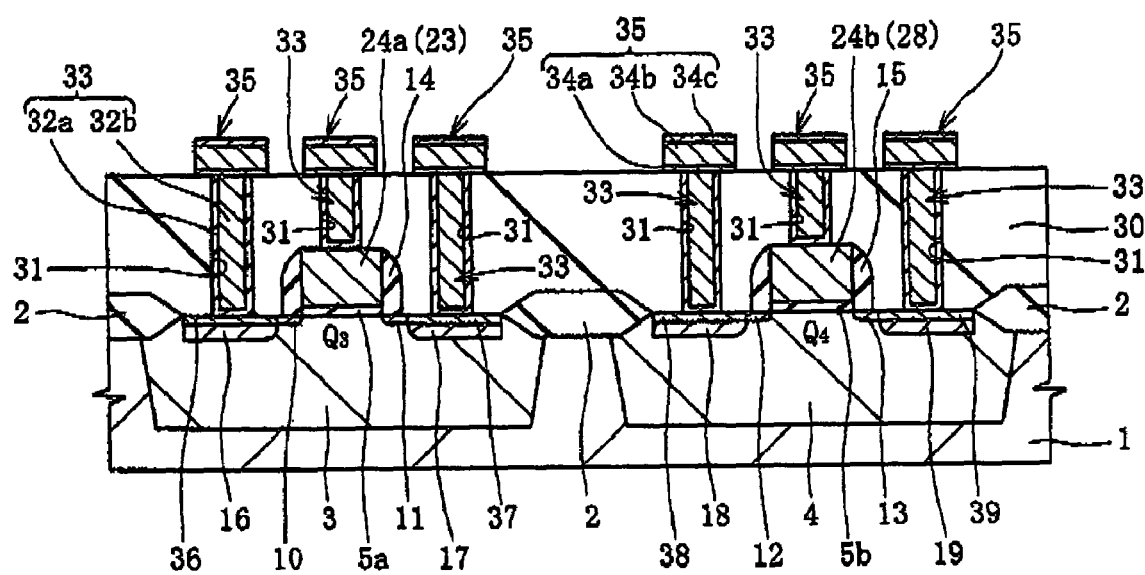
FIG. 14 is a cross-sectional view showing a semiconductor device according to a second embodiment of the present invention.

FIG. 14 is a cross-sectional view showing an n-type MIS transistor Q3 and a p-type MIS transistor Q4 according to the second embodiment. In FIG. 14, since the configuration of the n-type MIS transistor Q3 and the p-type MIS transistor Q4 is almost the same as that of the n-type MIS transistor Q1 and the p-type MIS transistor Q2 according to the first embodiment, only the different parts will be described below.

The n-type MIS transistor Q3 according to the second embodiment is different from the n-type MIS transistor Q1 according to the first embodiment in that hafnium silicide films 36 and 37 are formed on high-concentration n-type impurity diffusion regions 16 and 17. More specifically, the hafnium silicide films 36 and 37 are formed on the high-concentration n-type impurity diffusion regions 16 and 17 in the n-type MIS transistor Q3, and the hafnium silicide films 36 and 37 are not formed on the high-concentration n-type impurity diffusion regions 16 and 17 in the n-type MIS transistor Q1.

By forming the hafnium silicide films 36 and 37 on the high-concentration n-type impurity diffusion region 16 serving as a part of the source region of the n-type MIS transistor Q3 and on the high-concentration n-type impurity diffusion region 17 serving as a part of the drain region of the n-type MIS transistor Q3 as described above, it is possible to reduce the resistances of the source region and the drain region.

Similarly, the p-type MIS transistor Q4 according to the second embodiment is different from the p-type MIS transistor Q2 according to the first embodiment in that platinum silicide films 38 and 39 are formed on the high-concentration p-type impurity diffusion regions 18 and 19, respectively. Since the platinum silicide films 38 and 39 are formed in the p-type MIS transistor Q4, the resistances of the source region and the drain region can be reduced.

The n-type MIS transistor Q3 and the p-type MIS transistor Q4 according to the second embodiment are formed as described above. A manufacturing method of the n-type MIS transistor Q3 and the p-type MIS transistor Q4 will be described below with reference to the accompanying drawings.

Figure 15:
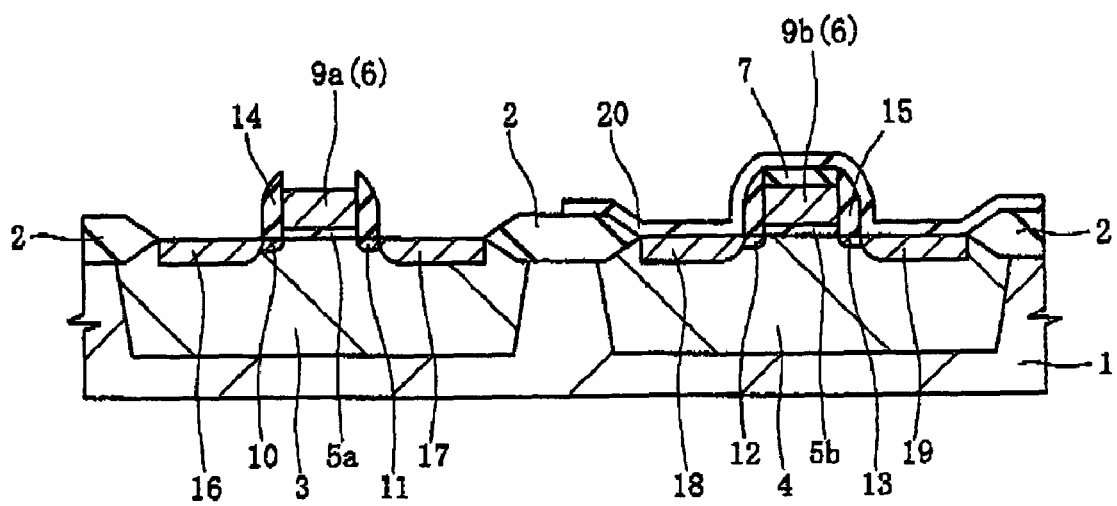
FIG. 15 is a cross-sectional view showing a step of manufacturing a semiconductor device according to the second embodiment.

First, the same process as that shown in FIGS. 2 to 7 in the first embodiment is performed. Next, as shown in FIG. 15, the silicon oxide film 20 in a forming region of the n-type MIS transistor Q3 and the silicon oxide film 7 formed on the dummy electrode 9a are removed by using a photolithography technique and an etching technique. By doing so, the upper portion of the dummy electrode 9a and the surfaces of the high-concentration n-type impurity diffusion regions 16 and 17 are exposed.

Figure 16:
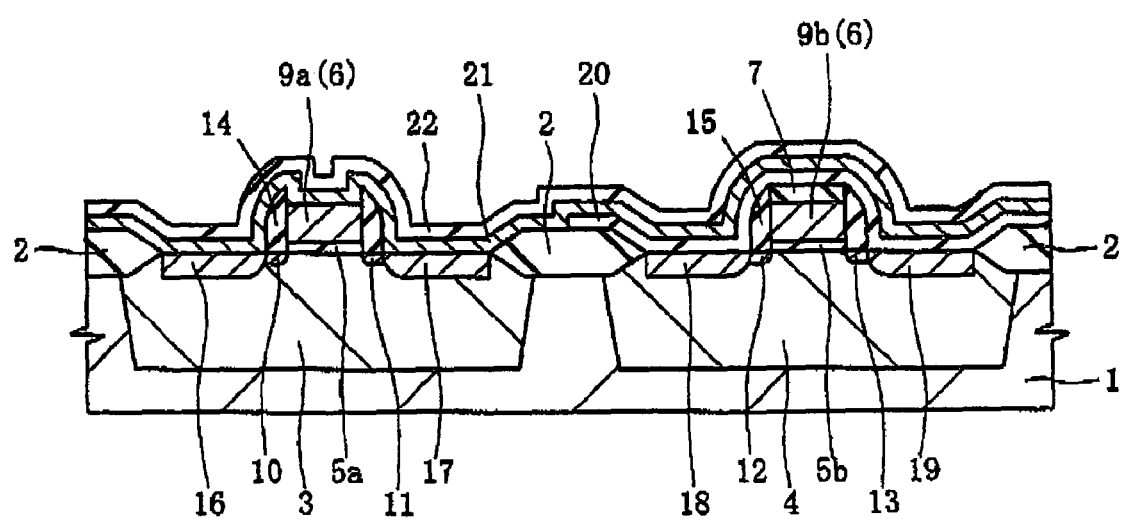
FIG. 16 is a cross-sectional view showing a step of manufacturing the semiconductor device subsequent to the step in FIG. 15.

Subsequently, as shown in FIG. 16, the hafnium film 21 and the silicon oxide film 22 are sequentially formed on a main surface of the semiconductor substrate 1. The hafnium film 21 can be formed by using, for example, a sputtering method, and the silicon oxide film 22 can be formed by using, for example, a CVD method. At this time, the hafnium film 21 is in direct contact with the upper portion of the dummy electrode 9a and the surfaces of the high-concentration n-type impurity diffusion regions 16 and 17.

Figure 17:
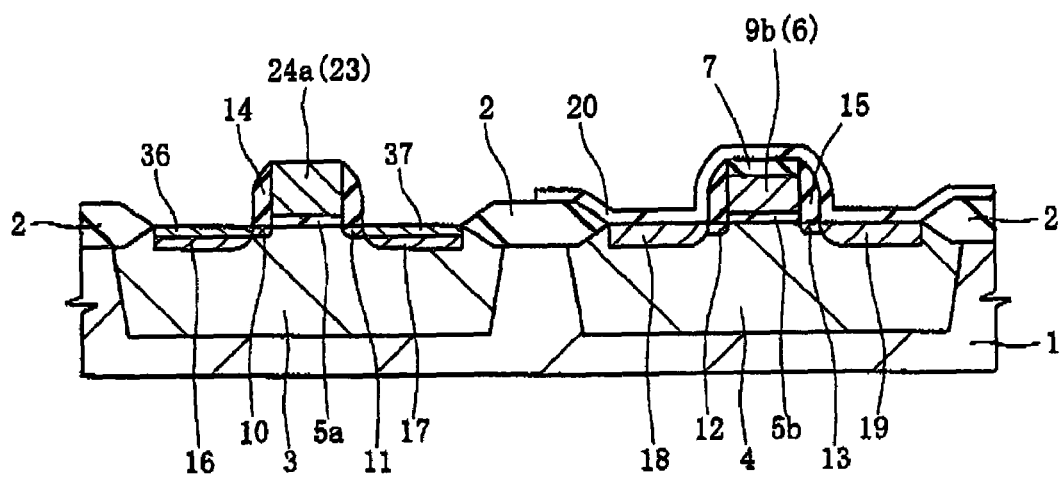
FIG. 17 is a cross-sectional view showing a step of manufacturing the semiconductor device subsequent to the step in FIG. 16.

Next, heat treatment at about 450° C. to 700° C. is performed. By doing so, a silicide reaction occurs between the polysilicon film 6 constituting the dummy electrode 9a and the hafnium film 21 which is in contact with the polysilicon film 6 to form the gate electrode 24a composed of the hafnium silicide film 23 as shown in FIG. 17. At this time, the silicide reaction occurs also on the surfaces of the high-concentration n-type impurity diffusion regions 16 and 17 to form the hafnium silicide films 36 and 37 on the high-concentration n-type impurity diffusion regions 16 and 17, respectively.

By the way, with the scaling down of a MIS transistor in recent years, the depths of the high-concentration n-type impurity diffusion regions 16 and 17 decrease. Therefore, when the hafnium silicide films 36 and 37 described above are formed on the high-concentration n-type impurity diffusion regions 16 and 17, respectively, the hafnium silicide films 36 and 37 may be formed not only on the surfaces of the high-concentration n-type impurity diffusion regions 16 and 17 but also in the high-concentration n-type impurity diffusion regions 16 and 17. In this case, the source region or the drain region is disadvantageously electrically connected to the semiconductor substrate 1. For it prevention, after the silicon oxide film 20 formed on the forming region of the n-type MIS transistor Q3 is removed (see FIG. 15), silicon may be selectively grown on the exposed high-concentration n-type impurity diffusion regions 16 and 17. In this manner, the thickness of a silicon layer to react with the hafnium film 21 can be increased, and the hafnium silicide films 36 and 37 can be prevented from penetrating the high-concentration n-type impurity diffusion regions 16 and 17.

Figure 18:
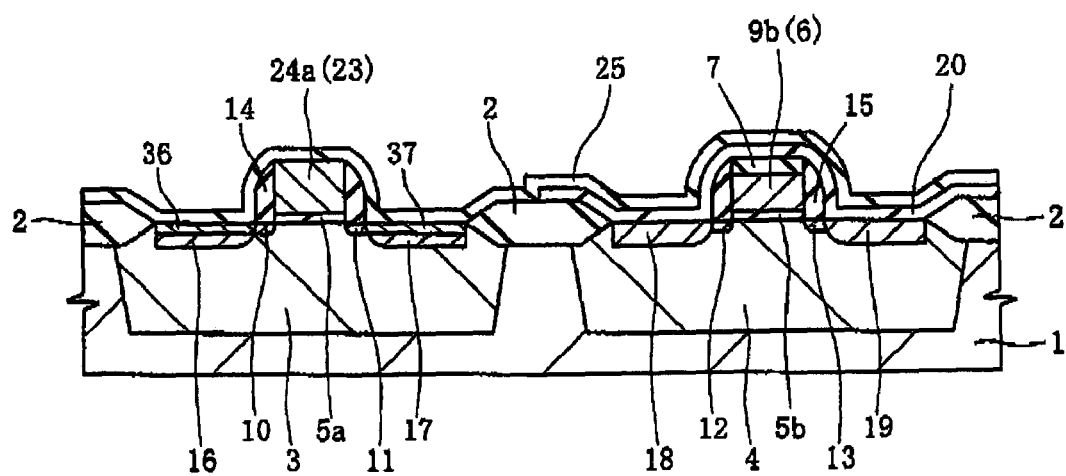
FIG. 18 is a cross-sectional view showing a step of manufacturing the semiconductor device subsequent to the step in FIG. 17.

Next, as shown in FIG. 18, the silicon oxide film 25 is formed on a main surface of the semiconductor substrate 1. The silicon oxide film 25 can be formed by using; for example, a CVD method. Subsequently, the silicon oxide film 25 and the silicon oxide film 20 formed in the forming region of the p-type MIS transistor Q4 are removed, and then, the silicon oxide film 7 formed on the dummy electrode 9b is removed by using a photolithography technique and an etching technique. In this manner, the upper portion of the dummy electrode 9b and the surfaces of the high-concentration p-type impurity diffusion regions 18 and 19 are exposed.

Figure 19:
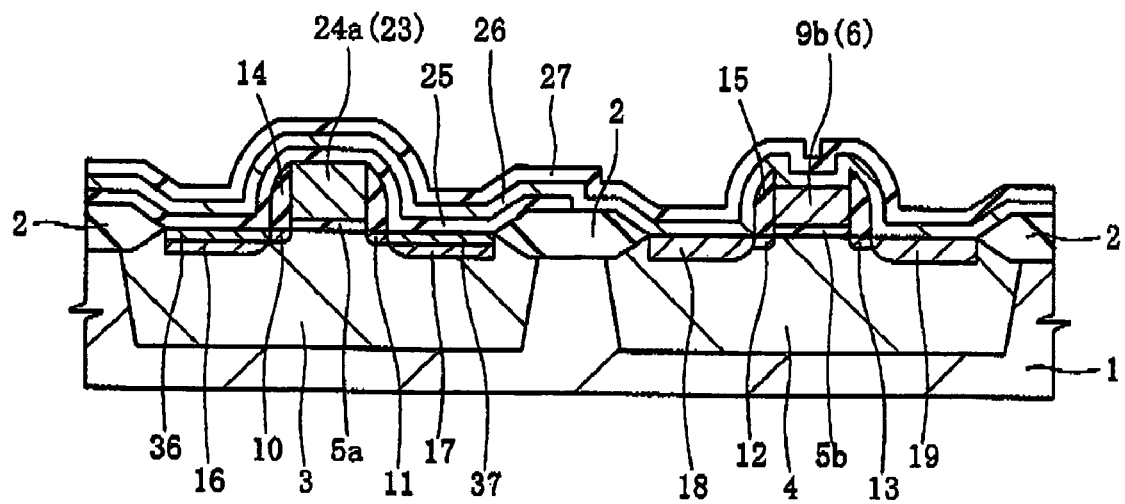
FIG. 19 is a cross-sectional view showing a step of manufacturing the semiconductor device subsequent to the step in FIG. 18.

Next, as shown in FIG. 19, the platinum film 26 and the silicon oxide film 27 are sequentially formed on a main surface of the semiconductor substrate 1. The platinum film 26 can be formed by using, for example, a sputtering method, and the silicon oxide film 27 can be formed by, for example, a CVD method. At this time, in the forming region of the p-type MIS transistor Q4, the platinum film 26 is formed so as to be in contact with the upper portions of the high-concentration p-type impurity diffusion regions 18 and 19 and the dummy electrode 9b.

Subsequently, heat treatment at about 300° C. to 500° C. is performed to cause silicon constituting the high-concentration p-type impurity diffusion regions 18 and 19 and the dummy electrode 9b to react with the platinum film 26 to form the gate electrode 24b formed of the platinum silicide film 28 and to form the platinum silicide films 38 and 39 on the high-concentration p-type impurity diffusion regions 18 and 19.

Figure 20:
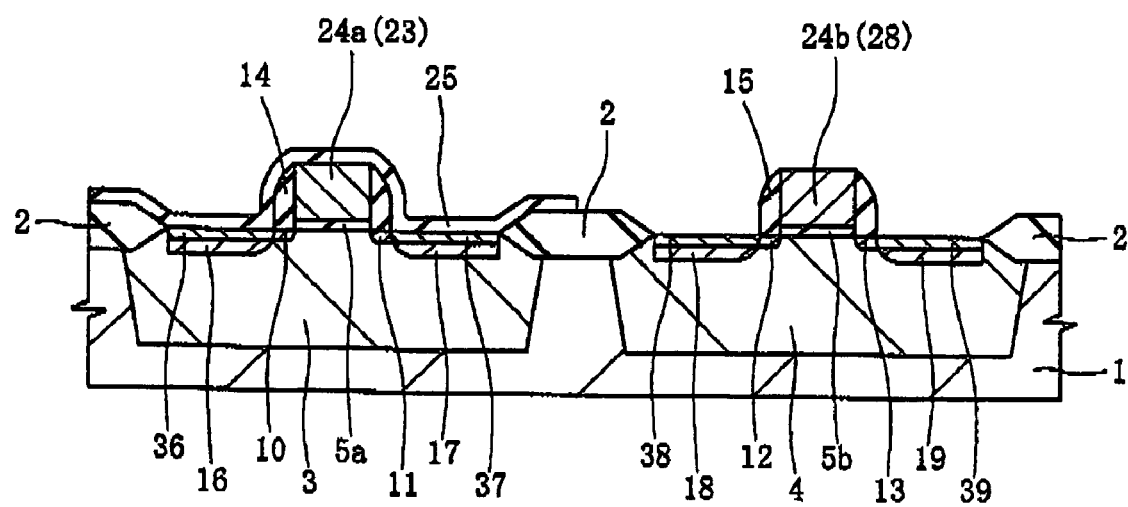
FIG. 20 is a cross-sectional view showing a step of manufacturing the semiconductor device subsequent to the step in FIG. 19.

Then, as shown in FIG. 20, after the silicon oxide film 27 and the unreacted platinum film 26 are removed, a wiring is formed through the same process as that described in the first embodiment (see FIG. 14). As shown in FIG. 20, after the unreacted platinum film 26 is removed, the silicon oxide film 25 is left in the forming region of the n-type MIS transistor Q3. An insulating interlayer may be formed after removing the silicon oxide film 25, or an insulating interlayer may be formed without removing the silicon oxide film 25.

In this manner, the n-type MIS transistor Q3 and the p-type MIS transistor Q4 are formed. According to the second embodiment, the gate electrode 24a of the n-type MIS transistor Q3 is formed of the hafnium silicide film 23, and the gate electrode 24b of the p-type MIS transistor Q4 is formed of the platinum silicide film 28. For this reason, threshold voltages in both the n-type MIS transistor Q3 and the p-type MIS transistor Q4 can be reduced.

Also, since the hafnium silicide films 36 and 37 are formed on the high-concentration n-type impurity diffusion regions 16 and 17 in the n-type MIS transistor Q3 and the platinum silicide films 38 and 39 are formed on the high-concentration p-type impurity diffusion regions 18 and 19 of the p-type MIS transistor Q4, the resistances of the source regions and the drain regions in each of the transistors can be reduced.

The hafnium silicide films 36 and 37 according to the second embodiment are formed in the step of forming the gate electrode 24a composed of the hafnium silicide film 23. Therefore, it is possible to reduce the number of steps in comparison to that when the hafnium silicide films 36 and 37 are formed independently. Since the same is true of the step of forming the platinum silicide films 38 and 39, the number of steps can be reduced.

Similar to the first embodiment, activation annealing is performed before the gate electrodes 24a and 24b formed in the second embodiment. Therefore, high-temperature heat treatment such as activation annealing is not performed after forming the gate electrodes 24a and 24b. For this reason, the same effect described in the first embodiment can be achieved.

Third Embodiment

In the description of the second embodiment, the same metal silicide films as metal silicide films constituting gate electrodes are formed on the source region and the drain region in the n-type MIS transistor and the p-type MIS transistor. Meanwhile, in the third embodiment, the case where metal silicide films formed on a source region and a drain region of an n-type MIS transistor are formed of the same films as metal silicide films formed on a source region and a drain region of a p-type MIS transistor will be described.

Figure 21:
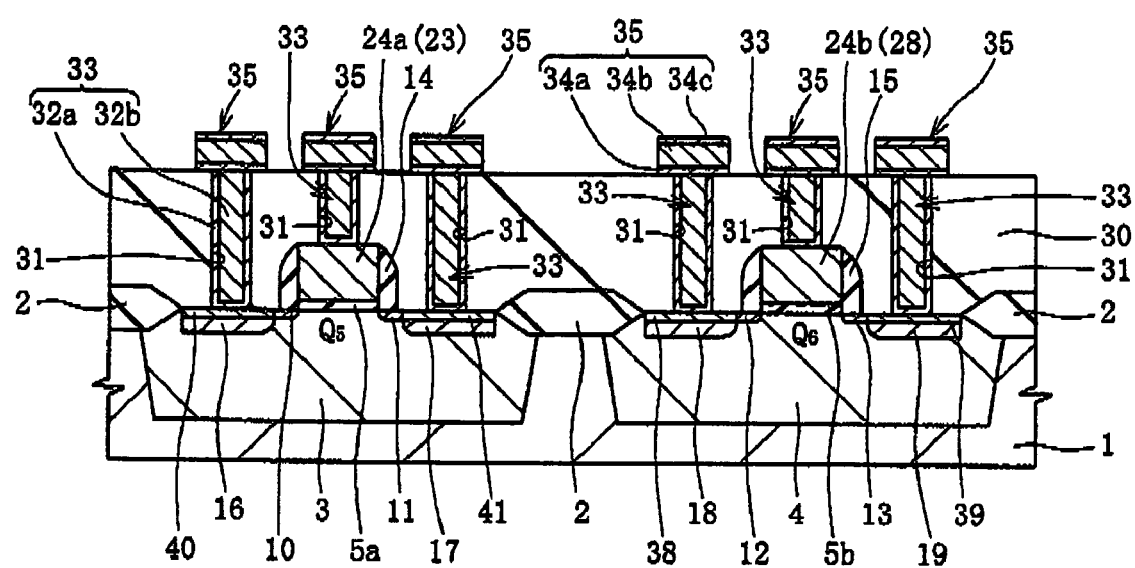
FIG. 21 is a cross-sectional view showing a semiconductor device according to a third embodiment of the present invention.

FIG. 21 is a cross-sectional view showing an n-type MIS transistor Q5 and a p-type MIS transistor Q6 according to the third embodiment. In FIG. 21, since the configuration of the n-type MIS transistor Q5 is almost the same as that of the n-type MIS transistor Q3 according to the second embodiment, only the different parts will be described below.

The n-type MIS transistor Q5 according to the third embodiment is different from the n-type MIS transistor Q3 according to the second embodiment in the following point. That is, platinum silicide films 40 and 41 are formed on high-concentration n-type impurity diffusion regions 16 and 17 in the n-type MIS transistor Q5, and on the other hand, the hafnium silicide films 36 and 37 are formed on the high-concentration n-type impurity diffusion regions 16 and 17 in the n-type MIS transistor Q3. More specifically, in the n-type MIS transistor Q5 according to the third embodiment, the high-concentration n-type impurity diffusion regions (third impurity regions) 16 and 17 are formed outside the low-concentration n-type impurity diffusion regions (first impurity regions) 10 and 11, and the platinum silicide films 40 and 41 are formed on the high-concentration n-type impurity diffusion regions 16 and 17.

In this case, when the platinum silicide films 40 and 41 are formed in place of the hafnium silicide films 36 and 37, resistances can be reduced. Therefore, in the n-type MIS transistor Q5 according to the third embodiment, the sheet resistances of the source region and the drain region can be further reduced, and the drive speed of the n-type MIS transistor Q5 can be increased.

Also, the p-type MIS transistor Q6 according to the third embodiment has the same configuration as that of the p-type MIS transistor Q4 according to the second embodiment. More specifically, high-concentration p-type impurity diffusion regions (fourth impurity regions) 18 and 19 are formed outside the low-concentration p-type impurity diffusion regions (second impurity regions) 12 and 13 in the p-type MIS transistor Q6 according to the third embodiment, and the platinum silicide films 38 and 39 are formed on the high-concentration p-type impurity diffusion regions 18 and 19.

The n-type MIS transistor Q5 and the p-type MIS transistor Q6 according to the third embodiment have the configuration as described above. A manufacturing method of the n-type MIS transistor Q5 and the p-type MIS transistor Q6 will be described below with reference to the accompanying drawings.

Figure 22:
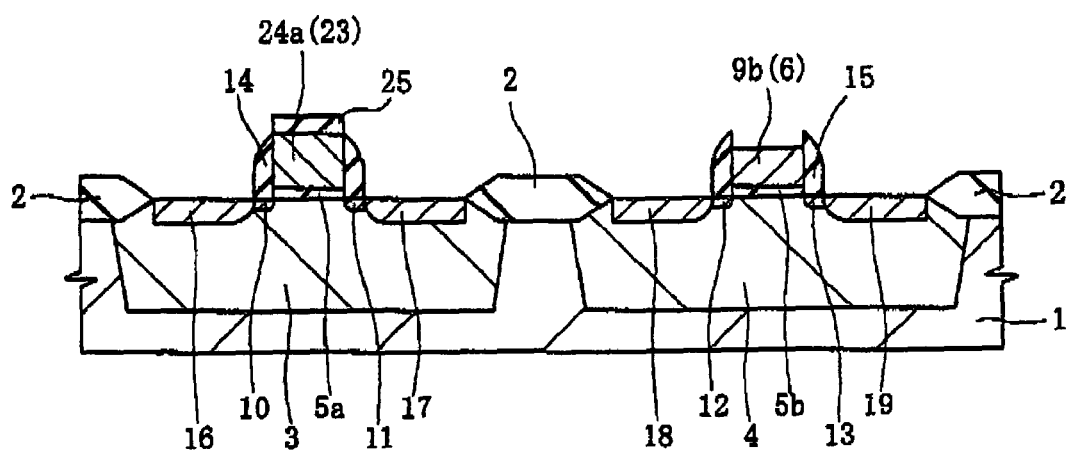
FIG. 22 is a cross-sectional view showing a step of manufacturing a semiconductor device according to the third embodiment.

First, the same process as that shown in FIGS. 2 to 10 in the first embodiment is performed. Next, the silicon oxide film 25 is formed on an element forming surface (main surface) of the semiconductor substrate 1 by using, for example, a CVD method. Thereafter, as shown in FIG. 22, the silicon oxide film 25 is patterned by using a photolithography technique and an etching technique, and the silicon oxide films 7 and 20 shown in FIG. 10 are removed. The silicon oxide film 25 is patterned so as to leave it only on the gate electrode 24a.

Figure 23:
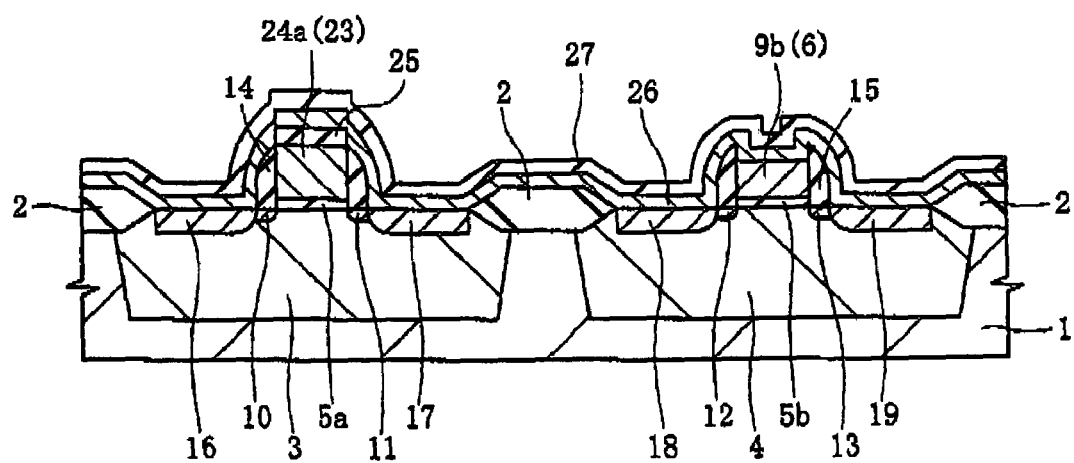
FIG. 23 is a cross-sectional view showing a step of manufacturing the semiconductor device subsequent to the step in FIG. 22.

Subsequently, as shown in FIG. 23, the platinum film 26 and the silicon oxide film 27 are sequentially formed on a main surface of the semiconductor substrate 1. The platinum film 26 can be formed by using, for example, a sputtering method, and the silicon oxide film 27 can be formed by using, for example, a CVD method. At this time, the platinum film 26 is in direct contact with the upper portion of the dummy electrode 9b and the surfaces of the high-concentration n-type impurity diffusion regions 16 and 17 and the high-concentration p-type impurity diffusion regions 18 and 19.

Figure 24:
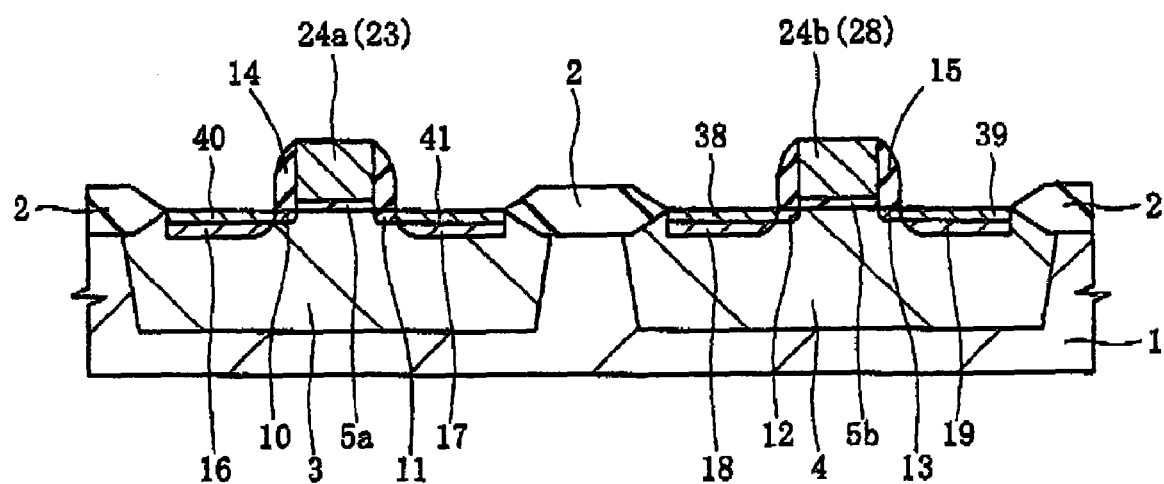
FIG. 24 is a cross-sectional view showing a step of manufacturing the semiconductor device subsequent to the step in FIG. 23.

Next, heat treatment at about 300° C. to 500° C. is performed. The heat treatment causes a silicide reaction between the polysilicon film 6 constituting the dummy electrode 9b and the platinum film 26, and the gate electrode 24b composed of the platinum silicide film 28 as shown in FIG. 24 is formed. At this time, the silicide reaction progresses also on the surfaces of the high-concentration n-type impurity diffusion regions 16 and 17 and the high-concentration p-type impurity diffusion regions 18 and 19 to form the platinum silicide films 38 to 41 on the high-concentration n-type impurity diffusion regions 16 and 17 and on the high-concentration p-type impurity diffusion regions 18 and 19.

Then, as shown in FIG. 24, after the silicon oxide films 25 and 27 and the unreacted platinum film are removed, a wiring is formed through the same process as described in the first embodiment (see FIG. 21).

In this manner, the n-type MIS transistor Q5 and the p-type MIS transistor Q6 can be formed. According to the third embodiment, the gate electrode 24a of the n-type MIS transistor Q5 is formed of the hafnium silicide film 23, and the gate electrode 24b of the p-type MIS transistor Q6 is formed of the platinum silicide film 28. Therefore, threshold voltages in both the n-type MIS transistor Q5 and the p-type MIS transistor Q6 can be reduced.

Also, in the n-type MIS transistor Q5, since the platinum silicide films 40 and 41 are formed on the high-concentration n-type impurity diffusion regions 16 and 17 in place of the hafnium silicide films 36 and 37, respectively, the sheet resistances can be further reduced.

Since the platinum silicide films 38 to 41 are formed in the step of forming the gate electrode 24b of the p-type MIS transistor Q6, it is possible to reduce the number of steps in comparison to the case where the platinum silicide films 38 to 41 are independently formed. In the third embodiment, the platinum silicide films 38 to 41 of the same type as that of the platinum silicide film 28 used for the gate electrode 24b of the p-type MIS transistor Q6 are formed on the high-concentration n-type impurity diffusion regions 16 and 17 and on the high-concentration p-type impurity diffusion regions 18 and 19. However, the third embodiment is not limited to the configuration, and the silicide films of the same type as that of the silicide film used for the gate electrode 24a of the n-type MIS transistor Q5 may be formed on the high-concentration n-type impurity diffusion regions 16 and 17 and on the high-concentration p-type impurity diffusion regions 18 and 19.

Also in the third embodiment, similar to the first embodiment, activation annealing is performed before the gate electrodes 24a and 24b are formed. Therefore, high-temperature heat treatment such as activation annealing is not performed after the gate electrodes 24a and 24b are formed. For this reason, the same effect as that described in the first embodiment can be achieved.

Fourth Embodiment

In the fourth embodiment, an example in which abnormal crystal growth due to a silicide reaction performed when forming a gate electrode can be reduced will be described below.

An n-type MIS transistor and a p-type MIS transistor according to the fourth embodiment have the same configuration as that of the n-type MIS transistor Q1 and the p-type MIS transistor Q2 shown in FIG. 1. However, a gate electrode 24a composed of a hafnium silicide film (first metal silicide film) 23 and a gate electrode 24b composed of a platinum silicide film (second metal silicide film) 28 contain an inert element such as argon or helium in some cases.

A manufacturing method of a semiconductor device according to the fourth embodiment will be described below with reference to the accompanying drawings.

Figure 25:
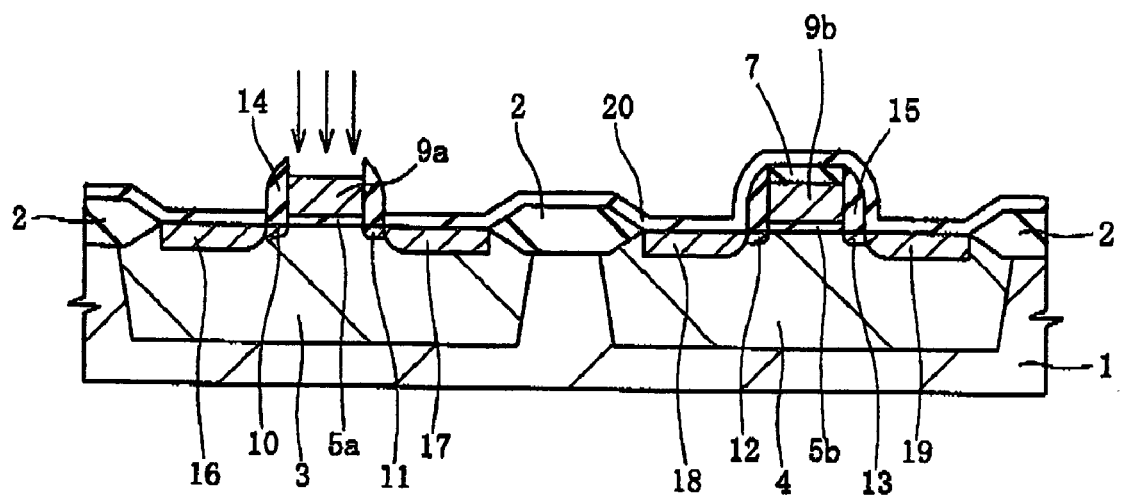
FIG. 25 is a cross-sectional view showing a step of manufacturing a semiconductor device according to a fourth embodiment of the present invention.

First, the same process as that shown in FIGS. 2 to 8 in the first embodiment is performed. Next, as shown in FIG. 25, an inert element such as argon or helium or silicon is implanted into a dummy electrode 9a composed of a polysilicon film by using an ion-implantation method. By doing so, the crystal structure of the polysilicon film constituting the dummy electrode 9a is broken by the implanted element, and an amorphous structure is formed.

Subsequently, as shown in FIG. 9, the hafnium film 21 and the silicon oxide film 22 are sequentially formed on a main surface of the semiconductor substrate 1. At this time, the hafnium film 21 is formed on the dummy electrode 9a formed of the amorphous silicon film so that the hafnium film 21 is in direct contact with the dummy electrode 9a.

Next, heat treatment at about 450° C. to 700° C. is performed. The heat treatment causes a silicide reaction between the amorphous silicon film and the hafnium film to form the gate electrode 24a composed of the hafnium silicide film 23 (see FIG. 10).

Next, as shown in FIG. 11, after a silicon oxide film 25 is formed on a main surface of the semiconductor substrate 1, the silicon oxide film 25 formed on the dummy electrode 9b is removed to expose an upper portion of the dummy electrode 9b.

Subsequently, an inert element such as argon or helium or silicon is implanted into the dummy electrode 9b by using an ion-implantation method. At this time, the crystal structure of the polysilicon film constituting the dummy electrode 9b is broken, and an amorphous structure is formed.

A platinum film 26 and a silicon oxide film 27 are sequentially formed on a main surface of the semiconductor substrate 1. At this time, the platinum film 26 is directly formed on the dummy electrode 9b composed of the amorphous silicon film (see FIG. 12).

Then, heat treatment at about 300° C. to 500° C. is performed to cause a silicide reaction between the amorphous silicon film and the platinum film to form the gate electrode 24b composed of the platinum silicide film 28 (see FIG. 13). Note that the subsequent process is the same as that in the first embodiment.

As described above, in the fourth embodiment, the gate electrode composed of the metal silicide film is formed by the silicide reaction between an amorphous silicon film and a metal film not by the silicide reaction between a polysilicon film and a metal film (hafnium film 21 or platinum film 26).

The polysilicon film is made of a plurality of small crystal grains bound together, and the crystal grains are separated by crystal grain boundaries. In this case, the silicide reaction between the polysilicon film and the metal film does not uniformly progress in the polysilicon film, but the silicide reaction tends to progress more easily in a crystal grain boundary between crystal grains than in the crystal grains. Therefore, the silicide reaction between the polysilicon film and the metal film does not progress uniformly, and there is the possibility that the abnormal crystal growth occurs.

For its prevention, in the fourth embodiment, an inert element or silicon is implanted into a polysilicon to break a crystal structure (crystal grains), so as to prevent the silicide reaction from progressing nonuniformly. Therefore, abnormal crystal growth in the silicide reaction can be reduced, and as a result, a production yield can be increased.

In the fourth embodiment, the configuration shown in FIG. 1 has been described. However, the method of the fourth embodiment can be applied not only to the configuration shown in FIG. 1 but also to the configuration shown in FIG. 14 or FIG. 21.

Fifth Embodiment

In a fifth embodiment, an example in which a MIS transistor having an LDD (Lightly Doped Drain) structure is formed without forming a sidewall will be described below.

Figure 26:
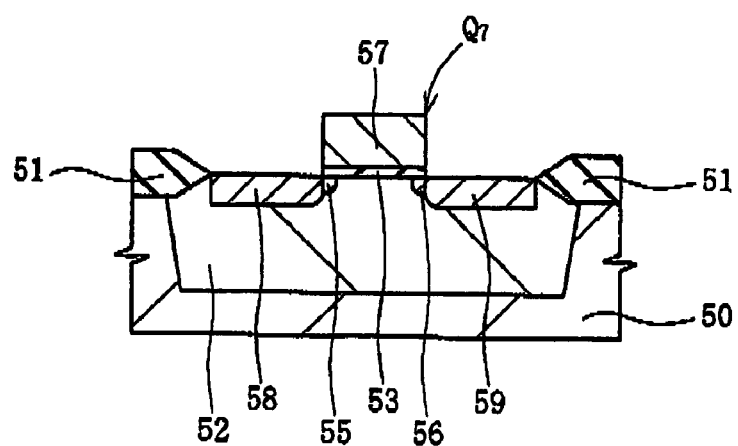
FIG. 26 is a cross-sectional view showing a semiconductor device according to a fifth embodiment of the present invention.

FIG. 26 is a cross-sectional view showing an n-type MIS transistor Q1 according to the firth embodiment. In FIG. 26, an element isolation region 51 is formed on a semiconductor substrate 50, and a p-type well 52 is formed in an active region isolated by the element isolation region 51. The n-type MIS transistor Q7 is formed on the p-type well 52.

The n-type MIS transistor Q7 has a gate insulating film 53 formed on the p-type well 52 and a gate electrode 57 formed on the gate insulating film 53. The gate insulating film 53 is composed of, for example, a silicon oxide film. However, the gate insulating film 53 may be composed of a so-called High-k film having a dielectric constant higher than that of the silicon oxide film. The gate electrode 57 is composed of a metal silicide film. More specifically, the gate electrode 57 is composed of a hafnium film. However, the gate electrode 57 can be composed of not only the hafnium film but also a silicide film of zirconium, tantalum, titanium, niobium, or a rare-earth metal.

Low-concentration n-type impurity diffusion regions (first impurity regions) 55 and 56 serving as semiconductor regions are formed in the p-type well 52 under the gate electrode 57. High-concentration n-type impurity diffusion regions (second impurity regions) 58 and 59 in which conductive impurities are implanted at concentrations higher than those of the low-concentration n-type impurity diffusion regions 55 and 56 are formed outside the low-concentration n-type impurity diffusion regions 55 and 56. The high-concentration n-type impurity diffusion regions 58 and 59 are formed so as to be aligned with the gate electrode 57.

Then, the low-concentration n-type impurity diffusion region 55 and the high-concentration n-type impurity diffusion region 58 form a source region of the n-type MIS transistor Q7 and the low-concentration n-type impurity diffusion region 56 and the high-concentration n-type impurity diffusion region 59 form a drain region of the n-type MIS transistor Q7. In this manner, the n-type MIS transistor Q7 has an LDD structure.

The n-type MIS transistor Q7 according to the fifth embodiment has the above configuration. A manufacturing method of the n-type MIS transistor Q7 will be described below with reference to the accompanying drawings.

Figure 27:
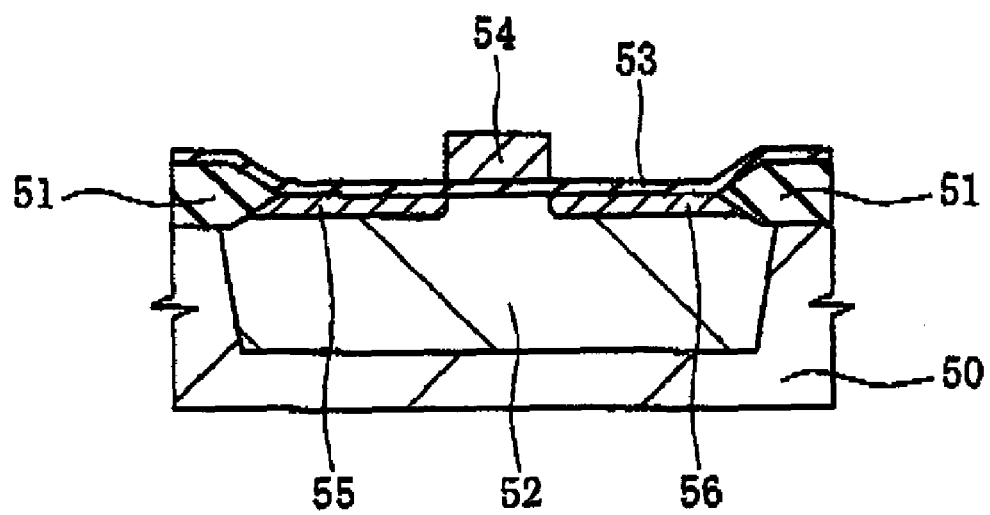
FIG. 27 is a cross-sectional view showing a step of manufacturing a semiconductor device in the fifth embodiment.

First, as shown in FIG. 27, the element isolation region 51 is formed on the semiconductor substrate 1. The element isolation region 51 is composed of, for example, a silicon oxide film and formed by an STI method, a LOCOS method, or the like.

Next, the p-type well 52 is formed in the active region isolated by the element isolation region 51. The p-type well 52 can be formed by implanting a p-type impurity into the semiconductor substrate 1 by using a photolithography and an ion implantation method. As the p-type impurity, boron, boron fluoride, or the like is used.

Subsequently, the gate insulating film 53 is formed on a main surface of the semiconductor substrate 1. The gate insulating film 53 is composed of, for example, a silicon oxide film and can be formed by, for example, a thermal oxidation method. As the gate insulating film 53, a silicon nitride film or a so-called High-k film made of, for example, hafnium oxide, alumina (aluminum oxide), hafnium aluminate, zirconia (zirconium oxide), silicon nitride, or rare-earth oxide such as $La_2O_3$ may be used.

Next, a polysilicon film is formed on the gate insulating film 53. The polysilicon film can be formed by, for example, a CVD method. Then, after a resist film (not shown) is formed on the polysilicon film by, for example, a spin coating method, the resist film is patterned by exposure and development. The resist film is patterned so as to leave it in a region where a dummy electrode is to be formed.

Subsequently, a dummy electrode 54 shown in FIG. 27 is formed by the etching with using the patterned resist film as a mask. Then, the low-concentration n-type impurity diffusion regions 55 and 56 are formed so as to be aligned with the dummy electrode 54. The low-concentration n-type impurity diffusion regions 55 and 56 can be formed by implanting an n-type impurity such as phosphorous or arsenic by using, for example, a photolithography technique and an ion implantation method.

Figure 28:
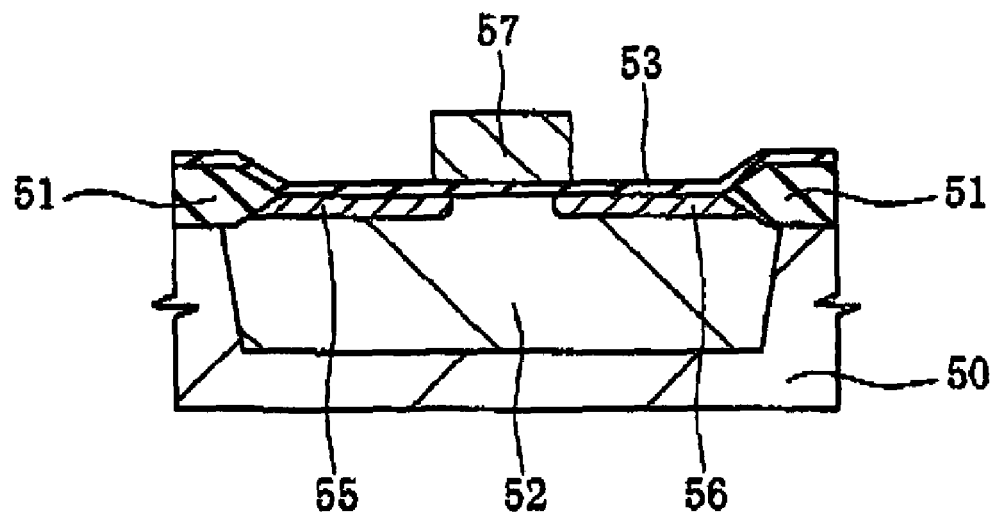
FIG. 28 is a cross-sectional view showing a step of manufacturing the semiconductor device subsequent to the step in FIG. 27.

Next, a hafnium film is formed on a main surface of the semiconductor substrate 1. The hafnium film can be formed by using, for example, a sputtering method. Subsequently, heat treatment at about 450° C. to 700° C. is performed to cause a silicide reaction between the polysilicon film constituting the dummy electrode 54 and the hafnium film, thereby forming the gate electrode 57 shown in FIG. 28. The gate electrode 57 is composed of a hafnium silicide film. At this time, the volume of the gate electrode 57 composed of the hafnium silicide film is expanded in comparison to the dummy electrode 54 composed of the polysilicon film.

Subsequently, as shown in FIG. 26, the high-concentration n-type impurity diffusion regions 58 and 59 are formed so as to be aligned with the gate electrode 57 whose volume has been expanded. In this manner, the n-type MIS transistor Q7 according to the fifth embodiment can be formed.

According to the fifth embodiment, after the low-concentration n-type impurity diffusion regions 55 and 56 are formed so as to be aligned with the dummy electrode 54 composed of the polysilicon film, a silicide reaction between the polysilicon film of the dummy electrode 54 and the hafnium film is caused to form the gate electrode 57 whose volume has been expanded in comparison to the dummy electrode 54. Then, the high-concentration n-type impurity diffusion regions 58 and 59 are formed so as to be aligned with the gate electrode 57 whose volume has been expanded, thereby forming the n-type MIS transistor Q7 having an LDD structure. Therefore, it is possible to form the LDD structure without forming a sidewall. For this reason, the step of forming a sidewall can be omitted, and the process for manufacturing the n-type MIS transistor Q7 can be simplified.

In the description of the fifth embodiment, the n-type MIS transistor is exemplified. However, the method according to the fifth embodiment can also be applied to a p-type MIS transistor. In this case, the gate electrode can be composed of a silicide film of platinum, iridium, nickel, cobalt, tungsten, molybdenum, or a rare metal.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the first to fourth embodiments, after a gate electrode composed of a hafnium silicide film is formed in the n-type MIS transistor, a gate electrode composed of a platinum silicide film is formed in the p-type MIS transistor. However, the order is not limited to this. That is, it is possible to form the gate electrode composed of the hafnium silicide film in the n-type MIS transistor after the gate electrode composed of the platinum silicide film is formed in the p-type MIS transistor.

In general, a temperature of heat treatment to form a metal silicide film used for a gate electrode of an n-type MIS transistor is higher than that of heat treatment to form a metal silicide film used for a gate electrode of a p-type MIS transistor. For this reason, it is preferable that the metal silicide film to be the gate electrode of the p-type MIS transistor is formed after a metal silicide film to be the gate electrode of the n-type MIS transistor is formed. However, it is also possible to form the metal silicide film to be the gate electrode of the n-type MIS transistor after the metal silicide film to be the gate electrode of the p-type MIS transistor.

In the embodiments described above, a metal silicide film of one type is used as a gate electrode of an n-type MIS transistor. However, it is also possible to form a plurality of n-type MIS transistors having gate electrodes composed of different metal silicide films on a semiconductor substrate. By doing so, a plurality of n-type MIS transistors having different threshold voltages can be formed. Furthermore, an n-type MIS transistor having a gate electrode obtained by implanting a conductive impurity into a polysilicon film not into a metal silicide film and an n-type MIS transistor having a gate electrode obtained by forming a metal silicide film on a part of the polysilicon film can be formed at some parts on the semiconductor substrate. Note that the same is true of the p-type MIS transistors.

The present invention will be popularly used in the manufacturers that manufacture semiconductor devices.

What is claimed is:

1. A semiconductor device, comprising a CMIS transistor which includes:
   a p-type MIS transistor including
   (a1) a first gate insulating film formed over a semiconductor substrate,
   (a2) a first gate electrode formed over said first gate insulating film, and
   (a3) a first source region and a first drain region formed in said semiconductor substrate; and
   an n-type MIS transistor including
   (b1) a second gate insulating film formed over said semiconductor substrate,
   (b2) a second gate electrode formed over said second gate insulating film, and
   (b3) a second source region and a second drain region formed in said semiconductor substrate,
   wherein said first gate electrode includes a first metal silicide film, and said first metal silicide film is also formed over said first source region, said first drain region, said second source region, and said second drain region,
   wherein said second gate electrode includes a second metal silicide film which is different from said first metal silicide film,
   wherein said first metal silicide film has a work function approximate to the valence band of silicon,
   wherein said second metal silicide film has a work function approximate to the conduction band of silicon, and
   wherein said first metal silicide film has a sheet resistance smaller than a sheet resistance of said second metal silicide film.

2. A semiconductor device according to claim 1, wherein said first metal silicide film is a platinum silicide film.

3. A semiconductor device according to claim 2, wherein said second metal silicide film is a hafnium silicide film.

4. A semiconductor device according to claim 3, wherein said first and second gate insulating films have a dielectric constant higher than that of silicon oxide film.

5. A semiconductor device according to claim 4, wherein said first and second gate insulating films are formed of hafnium oxide, aluminum oxide, hafnium aluminate, zirconium oxide or $La_2O_3$.

6. A semiconductor device according to claim 1, wherein said first source region and said first drain region have a first p-type impurity region and a second p-type impurity region, respectively, said second p-type impurity region having a higher impurity concentration than said first p-type impurity region,
wherein said second source region and said second drain region have a first n-type impurity region and a second n-type impurity region, respectively, said second n-type impurity region having a higher impurity concentration than said first n-type impurity region, and
wherein said first metal silicide films are formed over said second p-type impurity region and said second n-type impurity region, respectively.

7. A semiconductor device according to claim 6, wherein said first metal silicide film is a platinum silicide film.

8. A semiconductor device according to claim 7, wherein said second metal silicide film is a hafnium silicide film.

9. A semiconductor device according to claim 8, wherein said first and second gate insulating films have a dielectric constant higher than that of silicon oxide film.

10. A semiconductor device according to claim 6, wherein said second metal silicide film is a hafnium silicide film.

11. A semiconductor device according to claim 6, wherein said first and second gate insulating films have a dielectric constant higher than that of silicon oxide film.

12. A semiconductor device according to claim 1, wherein said second metal silicide film is a hafnium silicide film.

13. A semiconductor device according to claim 1, wherein said first and second gate insulating films have a dielectric constant higher than that of silicon oxide film.

14. A semiconductor device according to claim 1, wherein said first and second gate insulating films are formed of hafnium oxide, aluminum oxide, hafnium aluminate, zirconium oxide or $La_2O_3$.

* * * * *